United States Patent
Bibl et al.

(10) Patent No.: US 9,484,504 B2
(45) Date of Patent: Nov. 1, 2016

(54) MICRO LED WITH WAVELENGTH CONVERSION LAYER

(71) Applicant: LuxVue Technology Corporation, Santa Clara, CA (US)

(72) Inventors: Andreas Bibl, Los Altos, CA (US); Kelly McGroddy, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/894,255

(22) Filed: May 14, 2013

(65) Prior Publication Data

US 2014/0339495 A1 Nov. 20, 2014

(51) Int. Cl.
*H01L 33/50* (2010.01)
*H01L 33/06* (2010.01)
*H01L 27/15* (2006.01)

(52) U.S. Cl.
CPC ........... *H01L 33/504* (2013.01); *H01L 27/156* (2013.01); *H01L 33/06* (2013.01); *H01L 33/502* (2013.01); *H01L 2224/18* (2013.01)

(58) Field of Classification Search
CPC ...... H01L 33/504; H01L 33/44; H01L 33/52
USPC ............ 257/13, 98, E33.008; 438/27, 38, 26
See application file for complete search history.

(56) References Cited

U.S. PATENT DOCUMENTS

| | | | |
|---|---|---|---|
| 5,442,254 A | 8/1995 | Jaskie | |
| 5,592,358 A | 1/1997 | Shamouilian et al. | |
| 5,839,187 A | 11/1998 | Sato et al. | |
| 5,851,664 A | 12/1998 | Bennett et al. | |
| 5,888,847 A | 3/1999 | Rostoker et al. | |
| 5,903,428 A | 5/1999 | Grimard et al. | |
| 5,996,218 A | 12/1999 | Shamouilian et al. | |
| 6,071,795 A | 6/2000 | Cheung et al. | |
| 6,335,263 B1 | 1/2002 | Cheung et al. | |
| 6,403,985 B1 | 6/2002 | Fan et al. | |
| 6,420,242 B1 | 7/2002 | Cheung et al. | |
| 6,521,511 B1 | 2/2003 | Inoue et al. | |

(Continued)

FOREIGN PATENT DOCUMENTS

| | | |
|---|---|---|
| EP | 1780798 A1 | 5/2007 |
| JP | 07-060675 A | 3/1995 |

(Continued)

OTHER PUBLICATIONS

Asano, Kazutoshi, et al., "Fundamental Study of an Electrostatic Chuck for Silicon Wafer Handling" IEEE Transactions on Industry Applications, vol. 38, No. 3, May/Jun. 2002, pp. 840-845.

(Continued)

*Primary Examiner* — Matthew Landau
*Assistant Examiner* — Eric Ashbahian
(74) *Attorney, Agent, or Firm* — Blakely, Sokoloff, Taylor & Zafman LLP

(57) ABSTRACT

A light emitting device and method of manufacture are described. In an embodiment, the light emitting device includes a micro LED device bonded to a bottom electrode, a top electrode in electrical contact with the micro LED device, and a wavelength conversion layer around the micro LED device. The wavelength conversion layer includes phosphor particles. Exemplary phosphor particles include quantum dots that exhibit luminescence due to their size, or particles that exhibit luminescence due to their composition.

30 Claims, 15 Drawing Sheets

(56) References Cited

U.S. PATENT DOCUMENTS

| | | |
|---|---|---|
| 6,558,109 B2 | 5/2003 | Gibbel |
| 6,613,610 B2 | 9/2003 | Iwafuchi et al. |
| 6,629,553 B2 | 10/2003 | Odashima et al. |
| 6,670,038 B2 | 12/2003 | Sun et al. |
| 6,786,390 B2 | 9/2004 | Yang et al. |
| 6,878,607 B2 | 4/2005 | Inoue et al. |
| 7,033,842 B2 | 4/2006 | Haji et al. |
| 7,148,127 B2 | 12/2006 | Oohata et al. |
| 7,199,397 B2 | 4/2007 | Huang et al. |
| 7,208,337 B2 | 4/2007 | Eisert et al. |
| 7,353,596 B2 | 4/2008 | Shida et al. |
| 7,358,158 B2 | 4/2008 | Aihara et al. |
| 7,399,429 B2 | 7/2008 | Liu et al. |
| 7,482,059 B2 | 1/2009 | Peng et al. |
| 7,482,696 B2 | 1/2009 | Shei |
| 7,585,703 B2 | 9/2009 | Matsumura et al. |
| 7,622,367 B1 | 11/2009 | Nuzzo et al. |
| 7,723,764 B2 | 5/2010 | Oohata et al. |
| 7,795,629 B2 | 9/2010 | Watanabe et al. |
| 7,797,820 B2 | 9/2010 | Shida et al. |
| 7,838,410 B2 | 11/2010 | Hirao et al. |
| 7,854,365 B2 | 12/2010 | Li et al. |
| 7,880,184 B2 | 2/2011 | Iwafuchi et al. |
| 7,884,543 B2 | 2/2011 | Doi |
| 7,888,690 B2 | 2/2011 | Iwafuchi et al. |
| 7,906,787 B2 | 3/2011 | Kang |
| 7,910,945 B2 | 3/2011 | Donofrio et al. |
| 7,927,976 B2 | 4/2011 | Menard |
| 7,928,465 B2 | 4/2011 | Lee et al. |
| 7,972,875 B2 | 7/2011 | Rogers et al. |
| 7,982,296 B2 | 7/2011 | Nuzzo et al. |
| 7,989,266 B2 | 8/2011 | Borthakur et al. |
| 7,999,454 B2 | 8/2011 | Winters et al. |
| 8,023,248 B2 | 9/2011 | Yonekura et al. |
| 8,264,777 B2 | 9/2012 | Skipor et al. |
| 8,294,168 B2 | 10/2012 | Park et al. |
| 8,329,485 B2 | 12/2012 | McKean |
| 8,333,860 B1 | 12/2012 | Bibl et al. |
| 8,349,116 B1 | 1/2013 | Bibl et al. |
| 8,415,767 B1 | 4/2013 | Golda et al. |
| 8,415,768 B1 | 4/2013 | Golda et al. |
| 8,415,771 B1 | 4/2013 | Golda et al. |
| 8,426,227 B1 | 4/2013 | Bibl et al. |
| 8,440,546 B2 | 5/2013 | Nuzzo et al. |
| 8,497,143 B2 | 7/2013 | Han |
| 8,497,512 B2 | 7/2013 | Nakamura et al. |
| 8,506,867 B2 | 8/2013 | Menard |
| 8,664,699 B2 | 3/2014 | Nuzzo et al. |
| 8,865,489 B2 | 10/2014 | Rogers et al. |
| 8,877,648 B2 | 11/2014 | Bower et al. |
| 8,889,485 B2 | 11/2014 | Bower |
| 8,934,259 B2 | 1/2015 | Bower et al. |
| 2001/0029088 A1 | 10/2001 | Odajima et al. |
| 2002/0076848 A1 | 6/2002 | Spooner et al. |
| 2003/0010975 A1 | 1/2003 | Gibb et al. |
| 2003/0015721 A1 | 1/2003 | Slater, Jr. et al. |
| 2003/0040142 A1 | 2/2003 | Lin et al. |
| 2003/0177633 A1 | 9/2003 | Haji et al. |
| 2004/0232439 A1 | 11/2004 | Gibb et al. |
| 2005/0017256 A1 | 1/2005 | Slater, Jr. et al. |
| 2005/0232728 A1 | 10/2005 | Rice et al. |
| 2006/0065905 A1 | 3/2006 | Eisert et al. |
| 2006/0157721 A1 | 7/2006 | Tran et al. |
| 2006/0160276 A1 | 7/2006 | Brown et al. |
| 2006/0169993 A1* | 8/2006 | Fan ............... H01L 27/153 257/88 |
| 2006/0214299 A1 | 9/2006 | Fairchild et al. |
| 2007/0048902 A1 | 3/2007 | Hiatt et al. |
| 2007/0111324 A1 | 5/2007 | Nie et al. |
| 2007/0166851 A1* | 7/2007 | Tran et al. ............... 438/22 |
| 2007/0194330 A1 | 8/2007 | Ibbetson et al. |
| 2008/0023715 A1* | 1/2008 | Choi ............... H01L 33/504 257/98 |
| 2008/0142817 A1 | 6/2008 | Ibbetson et al. |
| 2008/0163481 A1 | 7/2008 | Shida et al. |
| 2008/0194054 A1 | 8/2008 | Lin et al. |
| 2008/0196237 A1 | 8/2008 | Shinya et al. |
| 2008/0283190 A1 | 11/2008 | Papworth et al. |
| 2008/0303038 A1 | 12/2008 | Grotsch et al. |
| 2009/0014748 A1* | 1/2009 | Hirao et al. ............... 257/99 |
| 2009/0068774 A1 | 3/2009 | Slater et al. |
| 2009/0140282 A1 | 6/2009 | Wu et al. |
| 2009/0146303 A1 | 6/2009 | Kwon |
| 2009/0230383 A1 | 9/2009 | Meng et al. |
| 2009/0303713 A1 | 12/2009 | Chang et al. |
| 2009/0314991 A1 | 12/2009 | Cho et al. |
| 2010/0105172 A1 | 4/2010 | Li et al. |
| 2010/0167441 A1* | 7/2010 | Ray ............... G09G 3/32 438/29 |
| 2010/0188794 A1 | 7/2010 | Park et al. |
| 2010/0203659 A1 | 8/2010 | Akaike et al. |
| 2010/0203661 A1 | 8/2010 | Hodota |
| 2010/0213467 A1 | 8/2010 | Lee et al. |
| 2010/0248484 A1 | 9/2010 | Bower et al. |
| 2010/0252173 A1* | 10/2010 | Ray ............... G09F 9/33 156/73.6 |
| 2010/0276726 A1 | 11/2010 | Cho et al. |
| 2010/0321640 A1* | 12/2010 | Yeh et al. ............... 353/31 |
| 2011/0001148 A1 | 1/2011 | Sun et al. |
| 2011/0003410 A1 | 1/2011 | Tsay et al. |
| 2011/0012141 A1* | 1/2011 | Le Toquin et al. ............... 257/89 |
| 2011/0049540 A1 | 3/2011 | Wang et al. |
| 2011/0089810 A1 | 4/2011 | Su |
| 2011/0151602 A1 | 6/2011 | Speier |
| 2011/0159615 A1 | 6/2011 | Lai |
| 2011/0210351 A1* | 9/2011 | Kim et al. ............... 257/89 |
| 2011/0210357 A1 | 9/2011 | Kaiser et al. |
| 2011/0242083 A1 | 10/2011 | Chiou |
| 2011/0284867 A1 | 11/2011 | Tran et al. |
| 2011/0297975 A1 | 12/2011 | Yeh et al. |
| 2011/0299044 A1* | 12/2011 | Yeh et al. ............... 353/52 |
| 2012/0018746 A1 | 1/2012 | Hsieh |
| 2012/0032573 A1 | 2/2012 | Lai |
| 2012/0064642 A1* | 3/2012 | Huang et al. ............... 438/15 |
| 2012/0132944 A1* | 5/2012 | Hsieh et al. ............... 257/98 |
| 2012/0134065 A1 | 5/2012 | Furuya et al. |
| 2012/0155076 A1* | 6/2012 | Li et al. ............... 362/231 |
| 2012/0161113 A1 | 6/2012 | Lowenthal et al. |
| 2012/0168776 A1 | 7/2012 | Nakamura et al. |
| 2012/0250304 A1 | 10/2012 | Harbers et al. |
| 2012/0286208 A1 | 11/2012 | McKean et al. |
| 2012/0326188 A1 | 12/2012 | Han |
| 2013/0056867 A1 | 3/2013 | Pagaila et al. |
| 2013/0069098 A1* | 3/2013 | Hikosaka et al. ............... 257/98 |
| 2013/0126081 A1 | 5/2013 | Hu et al. |
| 2013/0126891 A1 | 5/2013 | Bibl et al. |
| 2013/0187179 A1 | 7/2013 | Tan et al. |
| 2013/0210194 A1 | 8/2013 | Bibl et al. |
| 2013/0214297 A1* | 8/2013 | Yang et al. ............... 257/88 |
| 2013/0240880 A1* | 9/2013 | Lee et al. ............... 257/43 |
| 2013/0285082 A1* | 10/2013 | Bierhuizen ............... 257/88 |
| 2013/0285086 A1 | 10/2013 | Hu et al. |
| 2014/0027709 A1 | 1/2014 | Higginson et al. |
| 2014/0062315 A1* | 3/2014 | Tischler et al. ........... 315/185 R |
| 2014/0084482 A1 | 3/2014 | Hu et al. |
| 2014/0159043 A1 | 6/2014 | Sakariya et al. |
| 2014/0159064 A1 | 6/2014 | Sakariya et al. |
| 2014/0159067 A1 | 6/2014 | Sakariya et al. |
| 2014/0209936 A1* | 7/2014 | Oraw ............... H01L 25/0756 257/88 |
| 2014/0373898 A1 | 12/2014 | Rogers et al. |

FOREIGN PATENT DOCUMENTS

| | | |
|---|---|---|
| JP | 3406207 | 5/1999 |
| JP | 2001-298072 A | 10/2001 |
| JP | 2001-353682 A | 12/2001 |
| JP | 2002-134822 A | 5/2002 |
| JP | 2002-164695 A | 6/2002 |
| JP | 2002-176291 A | 6/2002 |
| JP | 2002-240943 A | 8/2002 |
| JP | 2004-095944 A | 3/2004 |
| JP | 2008-200821 A | 9/2008 |
| JP | 2010-056458 A | 3/2010 |

(56) References Cited

FOREIGN PATENT DOCUMENTS

| JP | 2010-186829 A | | 8/2010 | |
|---|---|---|---|---|
| KR | 10-0610632 B1 | | 8/2006 | |
| KR | 10-2007-0042214 A | | 4/2007 | |
| KR | 10-2007-0093091 A | | 9/2007 | |
| KR | 10-0973928 B1 | | 8/2010 | |
| KR | 10-1001454 B1 | | 12/2010 | |
| KR | 10-2007-0006885 A | | 1/2011 | |
| KR | 10-2011-0084888 A | | 7/2011 | |
| KR | 10-2013-0000506 | * | 1/2013 | ........... G02F 1/1335 |
| WO | WO 2005-099310 A2 | | 10/2005 | |
| WO | WO 2010/149027 A1 | | 12/2010 | |
| WO | WO 2011/082497 A1 | | 7/2011 | |
| WO | WO 2011/123285 | | 10/2011 | |

OTHER PUBLICATIONS

Bower, C.A., et al., "Active-Matrix OLED Display Backplanes Using Transfer-Printed Microscale Integrated Circuits", IEEE, 2010 Electronic Components and Technology Conference, pp. 1339-1343.
"Characteristics of electrostatic Chuck(ESC)" Advanced Materials Research Group, New Technology Research Laboratory, 2000, pp. 51-53 accessed at http://www.socnb.com/report/ptech_e/2000p51_e.pdf.
Guerre, Roland, et al, "Selective Transfer Technology for Microdevice Distribution" Journal of Microelectromechanical Systems, vol. 17, No. 1, Feb. 2008, pp. 157-165.
Han, Min-Koo, "AM backplane for AMOLED" Proc. of ASID '06, Oct. 8-12, New Delhi, pp. 53-58.
Harris, Jonathan H., "Sintered Aluminum Nitride Ceramics for High-Power Electronic Applications" Journal of the Minerals, Metals and Materials Society, vol. 50, No. 6, Jun. 1998, p. 56.
Horwitz, Chris M., "Electrostatic Chucks: Frequently Asked Questions" Electrogrip, 2006, 10 pgs, accessed at www.electrogrip.com.
Hossick-Schott, Joachim, "Prospects for the ultimate energy density of oxide-based capacitor anodes" Proceedings of CARTS Europe, Barcelona, Spain, 2007, 10 pgs.
Lee, San Youl, et al., "Wafer-level fabrication of GAN-based vertical light-emitting diodes using a multi-functional bonding material system" Semicond. Sci. Technol. 24, 2009, 4 pgs.
"Major Research Thrust: Epitaxial Layer Transfer by Laser Lift-off" Purdue University, Heterogeneous Integration Research Group, accessed at https://engineering.purdue.edu/HetInt/project_epitaxial_layer_transfer_llo.htm, last updated Aug. 2003.
Mei, Zequn, et al., "Low-Temperature Solders" Hewlett-Packard Journal, Article 10, Aug. 1996, pp. 1-10.
Mercado, Lei, L., et al., "A Mechanical Approach to Overcome RF MEMS Switch Stiction Problem" 2003 Electronic Components and Technology Conference, pp. 377-384.
Miskys, Claudio R., et al., "Freestanding GaN-substrates and devices" phys. Stat. sol. © 0, No. 6, 2003, pp. 1627-1650.
"Principles of Electrostatic Chucks: 1—Techniques for High Performance Grip and Release" ElectroGrip, Principles1 rev3 May 2006, 2 pgs, accessed at www.electrogrip.com.
Steigerwald, Daniel, et al., "III-V Nitride Semiconductors for High-Performance Blue and Green Light-Emitting Devices" article appears in journal JOM 49 (9) 1997, pp. 18-23. Article accessed Nov. 2, 2011 at http://www.tms.org/pubs/journals/jom/9709/setigerwald-9709.html, 12 pgs.
Widas, Robert, "Electrostatic Substrate Clamping for Next Generation Semiconductor Devices" Apr. 21, 1999, 4 pgs.
Park, et al., "Fabrication of Capacitive Micromachined Ultrasonic Transducers via Local Oxidation and Direct Wafer Bonding," IEEE, Journal of Microelectromechanical Systems, vol. 20, No. 1, Feb. 2011, pp. 95-103.
Patel, Prachi, "Quantum Dots Are Behind New Displays," IEEE Spectrum, accessed at http://spectrum.ieee.org/consumer-electronics/audiovideo/quantum-dots-are-behind-new-displays, Jun. 13, 2012, updated Jul. 17, 2012, 3 pgs.
Pickett, et al., "Matters—Commercial volumes of quantum dots: controlled nanoscale synthesis and micron-scale applications," Nanoco Group PLC, accessed at http://www.nanocotechnologies.com/content/Library/NewsandEvents/articles/Material_Matters_Commercial_volumes_of_quantum_dots_controlled_nanoscale_synthesis_and_microscale_applications/45.aspx, Dec. 13, 2007, 6 pgs.
Zhang, et al., "Micro-pixellated flip-chip InGaN and AlInGaN light-emitting diodes," Optical Society of America, 2007, 2 pgs.
PCT International Search Report and Written Opinion for International Application No. PCT/US2014/037399, mailed Sep. 1, 2014, 10 pages.
Griffin, C., et al, "Micro-pixellated flip-chip InGaN and AlInGaN light-emitting diodes," Optical Society of America, 2007, 2 pgs.
Furman, et al., "A High Concentration Photovoltaic Module Utilizing Micro-Transfer Printing and Surface Mount Technology" Photovoltaic Specialists Conference (PVSC), 2010 35th IEEE, 2010, pp. 000475-000480.
Hekmatshoar, et al., "A novel TFT-OLED integration for OLED-independent pixel programming in amorphous-Si AMOLED pixels" Journal of the SID 16/1, 2008, pp. 183-188.
Sarma, et al., "Active Matrix OLED Using 150oC a-Si TFT Backplane Built on Flexible Plastic Substrate" Presented at SPIE Symp. on Aerospace/Defense Sensing, Orlando, FL, Apr. 2003, and to be published in SPIE Proc. vol. 5080, paper 24 (2003), 12 pages.
Tsujimura, et al., "4.3 Passive-Matrix OLED Display" OLED Displays: Fundamentals and Applications, 2012, pp. 91-109, John Wiley & Sons, Inc., Hoboken, New Jersey, USA.
Yoo, et al., "Flexible GaN LED on a Polyimide Substrate for Display Applications" Quantum Sensing and Nanophotonic Devices IX, edited by Manijeh Razeghi, et al., 2012, Proc. of SPIE vol. 8268, pp. 82681Y-1 to 82681Y-6.
Long, K., et al., "Active-Matrix Amorphous-Silicon TFT Arrays at 180°C on Clear Plastic and Glass Substrates for Organic Light-Emitting Displays," IEEE Transactions on Electron Devices, vol. 53, No. 8, Aug. 2006, pp. 1789-1796.
Seong, Ryu-Gi, et al., "Flexible AMOLED Backplane Technology Using Pentacene TFT's," Proc. Int. Symp. Super-Functionality Organic Devices IPAP Conf. Series 6, pp. 146-149.
PCT International Preliminary Report on Patentability for International Application No. PCT/US2014/037399, mailed Nov. 26, 2015, 7 pages.

* cited by examiner

MICRO LED WITH WAVELENGTH CONVERSION LAYER

BACKGROUND

1. Field

The present invention relates to micro LED devices. More particularly embodiments of the present invention relate to a method and structure for integrating micro LED devices on a substrate with a tunable color emission spectrum.

2. Background Information

Quantum dots are semiconductor nanocrystals that can be tuned to emit light throughout the visible and infrared spectrum. Due to the small size of 1 to 100 nm, more typically 1 to 20 nm, quantum dots display unique optical properties that are different from those of the corresponding bulk material. The wavelength, and hence color, of the photo emission is strongly dependent on the size of a quantum dot. For an exemplary cadmium selenide (CdSe) quantum dot, light emission can be gradually tuned from red for a 5 nm diameter quantum dot, to the violet region for a 1.5 nm quantum dot. There are generally two types of schemes for quantum dot (QD) excitation. One uses photo excitation, and the other uses direct electrical excitation.

One proposed implementation for quantum dots is integration into the backlighting of a liquid crystal display (LCD) panel. Current white light emitting diode (LED) backlight technology for LCD panels utilizes a cerium doped YAG:Ce (yttrium aluminum garnet) down-conversion phosphor layer over a plurality of blue emitting LED chips. The combination of blue light from the LED chips and a broad yellow emission from the YAG:Ce phosphor results in a near white light. It has been proposed to replace the YAG:Ce phosphor with a blend of quantum dots to achieve the white backlighting.

Another proposed implementation for quantum dots is a quantum dot light emitting diode (QD-LED). The structure of the QD-LED is similar to that of the organic light emitting diode (OLED), with the major difference being that the organic emission layer from the OLED technology is replaced with a quantum dot film between a hole transporter layer and an electron transporter layer. Once an electric field is applied, the electrons and holes move into the quantum dot film, where they are captured in the quantum dots and recombine, emitting photons.

SUMMARY OF THE INVENTION

Light emitting devices for lighting or display applications are disclosed. In an embodiment, a light emitting device including a bottom electrode, a micro LED device bonded to the bottom electrode, a top electrode in electrical contact with the micro LED device, and a wavelength conversion layer around the micro LED device. The wavelength conversion layer includes phosphor particles. In an embodiment, the phosphor particles are dispersed within a matrix, such as glass or polymer. In an embodiment, phosphor particles are quantum dots whose emission properties are related to particle size and shape. In an embodiment, the phosphor particles exhibit luminescence due to their composition. In an embodiment, the wavelength conversion layer is dome shaped.

The micro LED device may have a maximum width of 1 µm-100 µm in some embodiments. In an embodiment the micro LED device comprise a quantum well layer within a p-n diode. The micro LED device can be designed to emit at specific wavelengths in the ultraviolet (UV) or visible spectrum. In some embodiments, the micro LED device emits a primarily blue light and is formed of a semiconductor material such as gallium nitride (GaN), indium gallium nitride (InGaN), or zinc selenide (ZnSe).

In an embodiment a light distribution layer is formed between the micro LED device and the wavelength conversion layer. The light distribution layer may be transparent. The light distribution layer may be dome shaped. In an embodiment, the light distribution layer is formed of a material such as glass, epoxy, silicone, and acrylic. The wavelength conversion layer may also be formed of a material such as glass, epoxy, silicone, and acrylic, and the two layers may be formed of the same material. In an embodiment, the refractive index of the light distribution layer and the wavelength conversion layer match. In another embodiment, the difference in refractive index is within 0.3, or more specifically within 0.1. In an embodiment, the light distribution layer is dome shaped.

An oxygen barrier film may be formed over the wavelength conversion layer. For example, the oxygen barrier film may include a material such as $Al_2O_3$, $SiO_2$, $SiN_x$, and spin on glass. Color filters can also be included in the light emitting devices. In one embodiment, a color filter is above the wavelength conversion layer. In another embodiment, a color filter such as a pigment or dye is dispersed within the wavelength conversion layer. The micro LED devices may also be placed within reflective bank structures. In an embodiment, the wavelength conversion layer is wider than the reflective bank structure in order to cover the sidewalls of the reflective bank structure.

The lighting and display applications in accordance with embodiments of the invention may include a plurality of micro LED devices, and a plurality of wavelength conversion layers around the plurality of micro LED devices, with each wavelength conversion layer comprising phosphor particles, for example, dispersed within a glass or polymer matrix. In some embodiments, each micro LED device is design to emit the same emission spectrum (e.g. visible spectrum or UV spectrum). In one embodiment, each wavelength conversion layer is designed to emit the same color emission spectrum. In another embodiment, there are multiple groups of wavelength conversion layers, with each group designed to emit a different color emission spectrum. For example, the different groups may be arranged into pixels, with each pixel comprising at least one micro LED device from each group. In an embodiment, each pixel is capable of emitting white light.

In an exemplary embodiment, a light emitting device includes an array of pixels with each pixel comprising a plurality of subpixels designed for different color emission spectra. A first subpixel may include a first micro LED device bonded to a first bottom electrode, a first top electrode in electrical contact with the first micro LED device, and a first wavelength conversion layer around the micro LED device, the first wavelength conversion layer comprising a first phosphor particles, for example dispersed within a glass or polymer matrix. A second subpixel may include a second micro LED device bonded to a second bottom electrode, a second top electrode in electrical contact with the second micro LED device, and a second wavelength conversion layer around the micro LED device, the second wavelength conversion layer comprising a second phosphor particles, for example dispersed within a glass or polymer matrix. In such an embodiment, the first and second micro LED devices have the same composition for the same emission spectrum, and the first and second phosphor particles are designed for different color emission spectra. In an embodiment, the first and second top electrodes are physically and electrically connected.

In an exemplary embodiment a first subpixel may include a first micro LED device bonded to a first bottom electrode, a first top electrode in electrical contact with the first micro LED device, and a first wavelength conversion layer around the micro LED device, the first wavelength conversion layer comprising a first phosphor particles, for example dispersed within a glass or polymer matrix. A second subpixel may include a second micro LED device bonded to a second bottom electrode, a second top electrode in electrical contact with the second micro LED device, wherein a wavelength conversion layer including phosphor particles is not formed around the second micro LED device.

DETAILED DESCRIPTION OF THE INVENTION

Figure 1A:
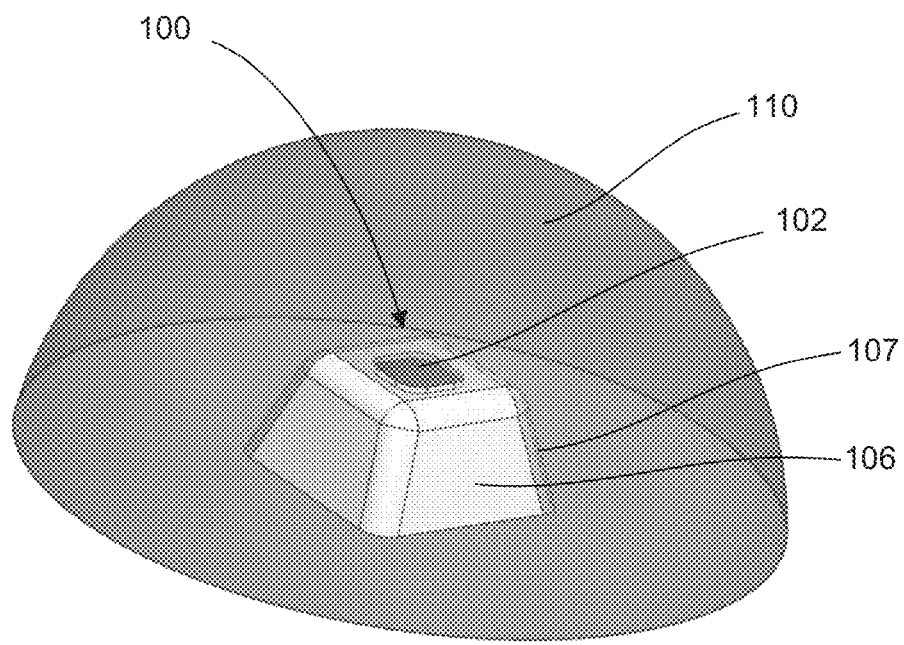
FIG. 1A is a top isometric view illustration of a micro LED device and wavelength conversion layer in accordance with an embodiment of the invention.

Embodiments of the present invention describe light emitting devices which incorporate a wavelength conversion layer around a micro LED device. The light emitting devices in accordance with embodiments of the invention may include a plurality of micro LED devices and a plurality of wavelength conversion layers. A variety of color emission spectra and patterns can be accomplished by selection of emission spectrum combinations for the micro LED devices and the wavelength conversion layers, where present, in the light emitting devices. In an embodiment, the wavelength conversion layer includes phosphor particles (e.g. quantum dots that exhibit luminescence due to their size and shape in addition to their composition, or particles that exhibit luminescence due to their composition). In this manner, the light emission can be accurately tuned to specific colors in the color spectrum, with improved color gamut.

In some embodiments, the wavelength conversion layer is a portion of a micro lens formed around a micro LED device. Each micro lens structure may include a variety of configurations and optionally include a number of different layers such as a light distribution layer, matching layer, oxygen barrier, and color filter. In some embodiments, the micro lens or specific layers forming the micro lens can be dome shaped. The dome shape profile may be hemispherical, flattened, or narrowed. For example, a hemispherical micro lens profile may improve light extraction and create a Lambertian emission pattern. Flattening or narrowing of the dome profile can be used to adjust viewing angle for the light emitting device. In accordance with embodiments of the invention, the thickness and profile the layers forming the micro lens structure can be adjusted in order to change the light emission beam profile from the micro LED device, as well as color over angle characteristics of the light emitting device which can be related to edge effects.

In one aspect, the incorporation of micro LED devices in accordance with embodiments of the invention can be used to combine the performance, efficiency, and reliability of wafer-based LED devices with the high yield, low cost, mixed materials of thin film electronics, for both lighting and display applications. The term "micro" LED device as used herein may refer to the descriptive size scale of 1 to 100 µm. For example, each micro LED device may have a maximum width of 1 to 100 µm, with smaller micro LED devices consuming less power. In some embodiments, the micro LED devices may have a maximum width of 20 µm, 10 µm, or 5 µm. In some embodiments, the micro LED devices have a maximum height of less than 20 µm, 10 µm, or 5 µm. Exemplary micro LED devices which may be utilized with some embodiments of the invention are described in U.S. Pat. No. 8,426,227, U.S. patent application Ser. No. 13/436,260, U.S. patent application Ser. No. 13/458,932, U.S. patent application Ser. No. 13/711,554, and U.S. patent application Ser. No. 13/749,647. The light emitting devices in accordance with embodiments of the invention may be highly efficient at light emission and consume very little power (e.g., 250 mW for a 10 inch diagonal display compared to 5-10 watts for a 10 inch diagonal LCD or OLED display), enabling reduction of power consumption of an exemplary display or lighting application incorporating the micro LED devices and wavelength conversion layers.

In another aspect, embodiments of the invention provide for configurations that allow phosphor particles of different emission spectra to be separated from one another while still providing good color mixing of the light as perceived by the viewer. Separating the phosphor particles from each other in each subpixel can prevent secondary absorption of light emitted from a phosphor particle emitting a different spectrum (e.g. absorption of green light emitted from a green emitting phosphor particle by a red emitting phosphor particle). This may increase efficiency and reduce unintended color shift. However, if phosphor particles are separated in a non-micro LED devices system, the different color emitting areas may be visible and result in spatially non-uniform color of the light source. In the micro LED devices systems in accordance with embodiments of the invention the spatial color separation can be small enough (e.g. approximately 100 µm or less) that it will not be perceived by the human eye. In this manner, the "micro" LED device scale enables the arrangement of micro LED devices and wavelength conversion layers including phosphor particles with small enough pitch (e.g. approximately 100 µm or less) between adjacent micro LED devices or subpixels that the spatial color separation is not perceived by the human eye.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment" means that a particular feature, structure, configuration, or characteristic described in connection with the embodiment is included in at least one embodiment of the invention. Thus, the appearances of the phrase "in one embodiment" in various places throughout this specification are not necessarily referring to the same embodiment of the invention. Furthermore, the particular features, structures, configurations, or characteristics may be combined in any suitable manner in one or more embodiments.

The terms "spanning", "over", "to", "between" and "on" as used herein may refer to a relative position of one layer with respect to other layers. One layer "spanning", "over" or "on" another layer or bonded "to" another layer may be directly in contact with the other layer or may have one or more intervening layers. One layer "between" layers may be directly in contact with the layers or may have one or more intervening layers.

Figure 1B:
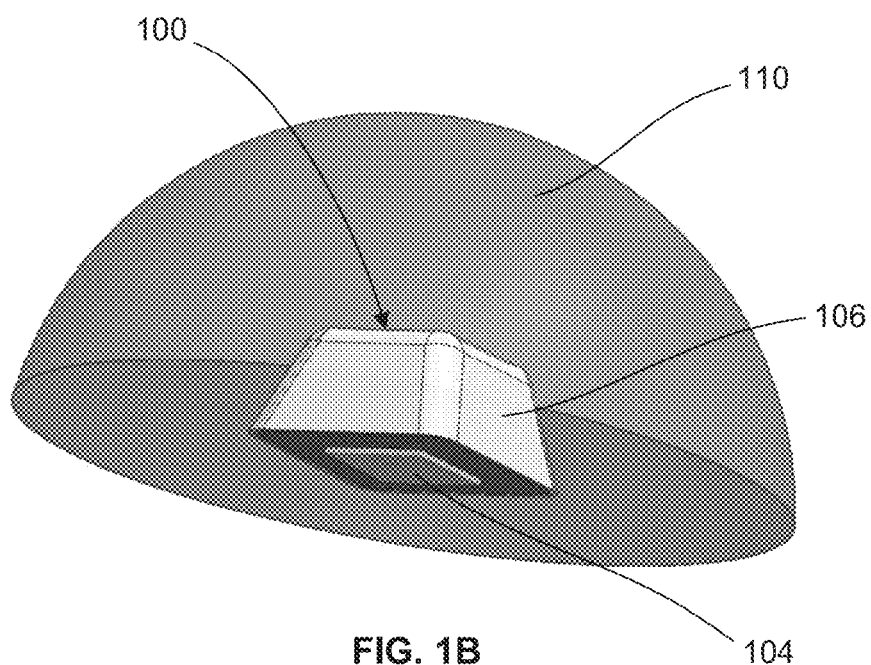
FIG. 1B is a bottom isometric view illustration of a micro LED device and wavelength conversion layer in accordance with an embodiment of the invention.

Referring now to FIGS. 1A-1B, top and bottom isometric view illustrations are provided of a micro LED device and wavelength conversion layer in accordance with an embodiment of the invention. The particular micro LED device 100 illustrated is a vertical micro LED device including a top conductive contact 102, a bottom conductive contact 104, and outwardly tapered sidewalls 106 between the top and bottom surfaces of the micro LED device 100. It is to be appreciated that such a configuration is exemplary, and is not required. For example, the micro LED devices can alternatively have inwardly shaped sidewalls or may assume different general shapes. Embodiments of the invention may also be practiced with LED devices that are not vertical LED devices. A wavelength conversion layer 110 is formed around the micro LED device in order to absorb light emitted from the micro LED device and emit a specific light emission wavelength, thereby converting the wavelength of light emission. As described herein a layer "around" a micro LED device may be formed laterally to, over, or below the micro LED device. Thus, the term "around" a micro LED device does not require the layer to be located at all directions from the micro LED device. Rather, the term "around" is intended to refer to a neighboring area through which the light emission beam path from the micro LED device is designed to pass through. In an embodiment, the wavelength conversion layer includes phosphor particles to control the light emission spectrum. In one embodiment, the wavelength conversion layer includes different phosphor particles (different in designed size or shape, or composition) for a blended color emission spectrum (e.g. a combination of any of red, blue, green, yellow, etc). In another embodiment, the wavelength conversion layer includes phosphor particles designed for a single color emission spectrum (e.g. red, blue, green, yellow, etc). For example, when arranged in a pixel configuration, each subpixel may contain a single phosphor color emission, where present. Each subpixel may likewise contain a different phosphor color emission, where present. In this manner, secondary absorption of light emitted from a phosphor particle emitting a different spectrum (e.g. absorption of green light emitted from a green emitting phosphor particle by a red emitting phosphor particle) is avoided. This may increase efficiency and reduce unintended color shift. Such pixel and subpixel configurations can be used for the final output of white light, or any other color of light. In accordance with some embodiments, the phosphor particles are dispersed in a matrix material of the wavelength conversion layer, such as a glass or polymer matrix. In another embodiment, the phosphor particles are not dispersed in a matrix material.

In accordance with embodiments of the invention, the term "phosphor" may refer to any type of wavelength converting material that will absorb light at one wavelength and emit light at another wavelength. One type of phosphor particle is a quantum dot. Quantum dots are semiconductor materials where the size of the structure is small enough (less than tens of nanometers) that the electrical and optical characteristics differ from the bulk properties due to quantum confinement effects. For example, the emission properties of quantum dots are related to their size and shape in addition to their composition. Fluorescence of quantum dots is a result of exciting a valence electron by absorbing a certain wavelength, followed by the emission of lower energy in the form of photons as the excited electrons return to the ground state. Quantum confinement causes the energy difference between the valence and conduction bands to change based on size and shape of the quantum dot meaning that the energy and wavelength of the emitted photons is determined by the size and shape of the quantum dot. The larger the quantum dot, the lower the energy of its fluorescence spectrum. Accordingly, smaller quantum dots emit bluer light (higher energy) and larger quantum dots emit redder light (lower energy). This allows size-dependent tuning of the semiconductor photoluminescence emission wavelength throughout the visible spectrum, with a sharp emission spectrum and high quantum efficiency.

Examples of quantum dot materials include, but are not limited to, groups II-VI, III-V, IV-VI semiconductor materials. Some exemplary compound semiconductors include CdS, CdSe, CdTe, ZnS, ZnSe, ZnTe, GaAs, GaP, GaAs, GaSb, HgS, HgSe, HgTe, InAs, InP, InSb, AlAs, AlP, AlSb. Some exemplary alloyed semiconductors include InGaP, ZnSeTe, ZnCdS, ZnCdSe, and CdSeS. Multi-core structures are also possible. Exemplary multi core configurations may include a semiconductor core material, a thin metal layer to protect the core from oxidation and to aid lattice matching, and a shell to enhance the luminescence properties. The core and shell layers may be formed of the same material, and may be formed of any of the exemplary compound semiconductors or alloyed semiconductors listed above. The metal layer often comprises Zn or Cd.

In accordance with embodiments of the invention, one type of phosphor particle is a particle that exhibits luminescence due to its composition. Some exemplary phosphor particles that exhibit luminescence due to their composition include sulfides, aluminates, oxides, silicates, nitrides, YAG (optionally doped with cerium), and terbium aluminum garnet (TAG) based materials. Other exemplary materials include yellow-green emitting phosphors: $(Ca,Sr,Ba)Al_2O_4$:Eu (green), $(Lu, Y)_3Al_5O_{12}:Ce^{3+}$(LuAG, YAG) (yellow-green), $Tb_3Al_5O_{12}:Ce^{3+}$(TAG) (yellow-green); orange-red emitting phosphors: $BaMgAl_{10}O_{17}:Eu^{2+}(Mn^{2+})$, $Ca_2Si_5N_8$:$Eu^{2+}$ (orange-red), (Zn,Mg)S:Mn (green, red), $(Ca,Sr,Ba)S$:$Eu^{2+}$ (red); uv-deep blue absorbing phosphors for blue and yellow-green emission: $(Mg,Ca,Sr,Ba)_2SiO_4:Eu^{2+}$ (uv-blue excitation, yellow emission), $(Mg,Ca,Sr,Ba)_3Si_2O_7:Eu^{2+}$ (uv-deep blue excitation, blue-green emission), $Ca_8Mg(SiO_4)_4Cl_2:Eu^{2+}$ (uv-deep blue excitation, blue emission); and phosphors that can emit over the full visible spectrum depending on composition and processing $(Sr,Ca,Ba)Si_{x-}O_yN_z:Eu^{2+}$ (y>0 green, y=0 red), $Y_2O_2S:Eu^{3+}$ (blue-green), $(Ca,Mg,Y)_vSi_wAl_xO_yN_z:Eu^2$ (yellow-green-red). In some embodiments the particle size for such phosphor particles may be from 1 μm to 20 μm. In other embodiments, the particles size for such phosphor particles can be nanoparticles from 100 nm to 1 μm. The phosphor particles can also include a blend of the 1 μm to 20 μm particles and 100 nm to 1 μm nanoparticles. Nanoparticles may be useful, for example, to reduce the amount of settling when dispersed within a matrix material of a wavelength conversion layer prior to curing or solvent removal, which may result in more even distribution of the nanoparticles and light emission of the light emitting device.

Other materials may also be dispersed within the wavelength conversion layer. For example, the other materials may be dispersed within the matrix material, such as glass or polymer matrix of the wavelength conversion layer. In an embodiment, a light scattering agent such as a $TiO_2$ or $Al_2O_3$ particles are dispersed within the wavelength conversion layer. Such light scattering agents may have the effect of increasing the phosphor particle efficiency by increasing scattered light within the wavelength conversion layer. Such light scattering agents may additionally have the effect of reduced bleeding of the micro LED device emitted light through the wavelength conversion layer. In an embodiment, a pigment or dye may be dispersed within the wavelength conversion layer 110. This may have the effect of incorporating a color filter into the wavelength conversion layer. In an embodiment, the pigment or dye may have a color similar to the emission wavelength of the phosphor particle. In this manner, the pigment or die can absorb wavelengths other than those being emitted from the phosphor particle, further sharpening the emission spectrum of the assembly. For example, in a particular embodiment, the micro LED device 100 is a gallium nitride (GaN) based material, and emits a blue (e.g. 450 nm-495 nm) or deep blue (e.g. 420 nm-450 nm) light. Quantum dots designed for red emission may be dispersed in the wavelength conversion layer 110 in order to absorb the blue or deep blue emission from the micro LED device 100 and convert the emission wavelength to red. In such an embodiment, a red pigment or dye may also be dispersed within the wavelength conversion layer 110 to also absorb colors other than red. In this manner, the red pigment or dye may absorb additional blue or deep blue light, thereby reducing bleeding of the unconverted blue or deep blue light. Exemplary pigments include lithol rubine (Red), B-copper thalocyanine (Blue), and diarylide yellow (Yellow). It is to be appreciated that a blue micro LED device and red phosphor particles with red pigment or dye is exemplary and a variety of emission spectrum configurations for the micro LED devices and wavelength conversion layers, where present, are possible.

In accordance with embodiments of the invention, the light emitting device configuration including the micro LED device and wavelength conversion layer can be incorporated into a variety of lighting or display devices. A plurality of micro LED devices can be bonded to bottom electrodes on a substrate and a plurality of wavelength conversion layers formed around the plurality of micro LED devices. The wavelength conversion layers can be designed to all emit the same color emission spectrum, or the wavelength conversion layers can be divided into multiple groups of wavelength conversion layers, with each group designed to emit a different color emission spectrum. In this manner, the light emitting devices can emit any color or patterns of colors depending upon the arrangement and content of the micro LED devices and wavelength conversion layers. In one embodiment, white light can be generated by incorporating red (e.g. 620 nm-750 nm) and green (e.g. 495 nm-570 nm) emitting phosphor particles in a wavelength conversion layer positioned around a blue emitting (e.g. 450 nm-495 nm) micro LED device. In another embodiment, white light can be generated by incorporating multiple micro LED devices into a pixel, with each micro LED device designed to emit the same emission spectrum (e.g. visible spectrum or UV spectrum), and different wavelength conversion layers designed to covert color emission. In this manner, by including phosphor particles of a single color emission spectrum in each wavelength conversion layer, secondary absorption of light emitted from different emission spectra of different phosphor particles is avoided. This may increase efficiency and reduce unintended color shift. For example, a pixel may contain 3 micro LED devices all designed to emit blue light, with one red emitting wavelength conversion layer around one micro LED device, one green emitting wavelength conversion layer around a second micro LED device, and the third micro LED device either not including a wavelength conversion layer around it or including a blue emitting wavelength conversion layer around it. In one embodiment, white light can be generated by incorporating multiple micro LED devices into a pixel, with each micro LED device designed to emit UV light, with one red emitting conversion layer around one micro LED device, one green emitting wavelength conversion layer around a second micro LED device, and one blue emitting wavelength conversion layer around a third micro LED device. In another embodiment, white light can be generated by incorporating combinations of micro LED devices designed for different emission spectrum and different wavelength conversion layers, or no wavelength conversion layers. In another exemplary embodiment, white light can be generated with a micro LED device designed for red emission with no overlying wavelength conversion layer, a micro LED device designed for blue emission with an overlying wavelength conversion layer designed for green emission, and a micro LED device designed for blue emission with no overlying wavelength conversion layer.

In the above exemplary embodiments, a red-green-blue (RGB) subpixel arrangement is obtained, and each pixel includes three subpixels that emit red, green and blue lights, respectively. It is to be appreciated that the RGB arrangement is exemplary and that embodiments are not so limited. Examples of other subpixel arrangements that can be utilized include, but are not limited to, red-green-blue-yellow (RGBY), red-green-blue-yellow-cyan (RGBYC), or red-green-blue-white (RGBW), or other subpixel matrix schemes where the pixels may have different number of subpixels, such as the displays manufactured under the trademark name PenTile®.

Figure 2A:
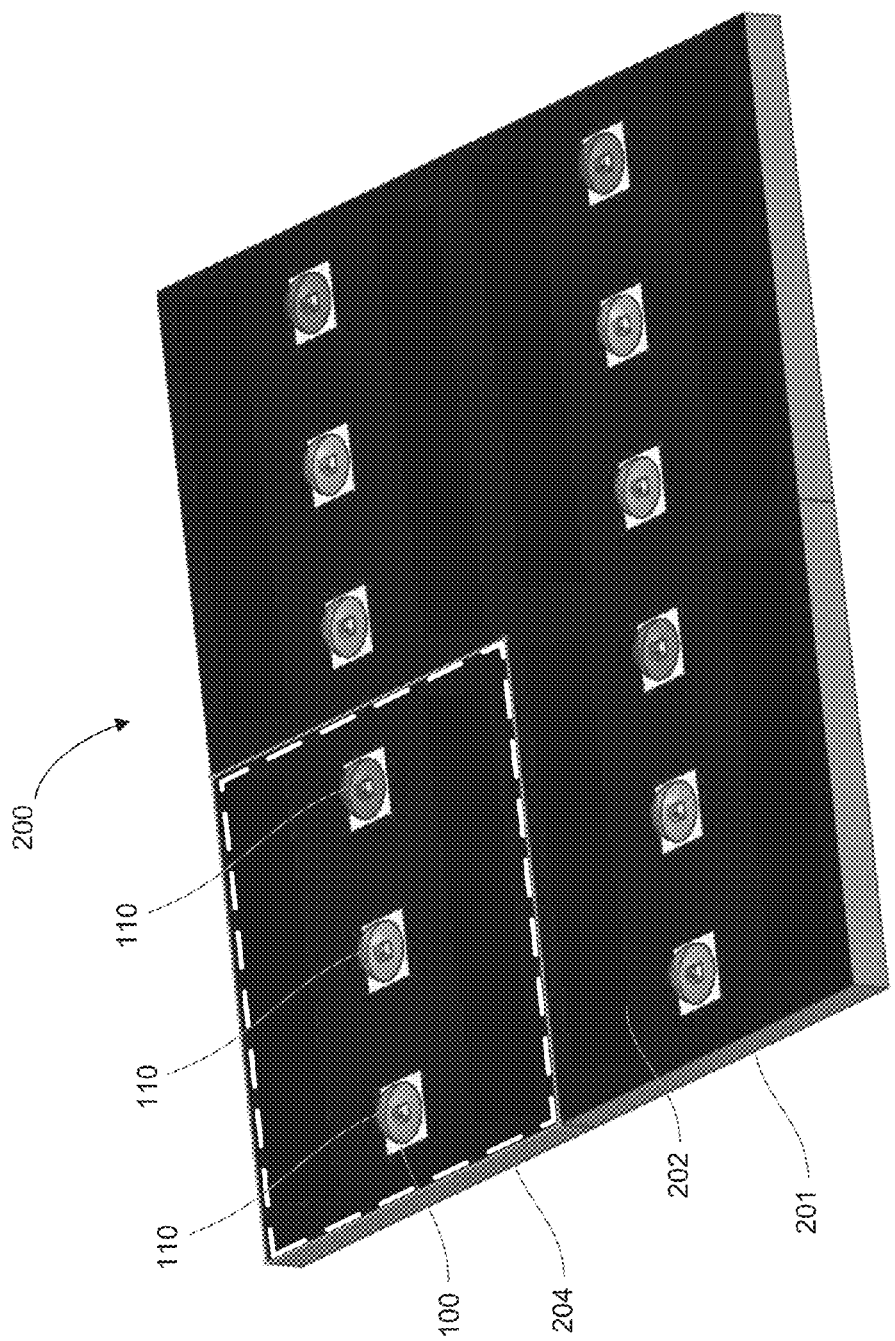
FIG. 2A is a top isometric view illustration of a light emitting device including a plurality of micro LED devices and a plurality of wavelength conversion layers around the plurality of micro LED devices in accordance with an embodiment of the invention.

Referring now to FIG. 2A, a top isometric view illustration is provided of a light emitting device 200 including a plurality of micro LED devices 100 bonded to a substrate 201, and a plurality of wavelength conversion layers 110 around the plurality of micro LED devices 100. In the particular embodiment illustrated, a pixel 204 includes a plurality of micro LED devices 100 and wavelength conversion layers 110 designed to convert emission, e.g. in an RGB subpixel arrangement. In an embodiment, a black matrix material 202 can be formed over the substrate 201 and between the micro LED devices 100 to absorb light and prevent color bleeding into adjacent pixels 204 or subpixels. Alternatively, the black matrix material 202 can be substituted with a white matrix material to reflect light and prevent color bleeding into adjacent pixels 204 or subpixels.

Figure 2B:
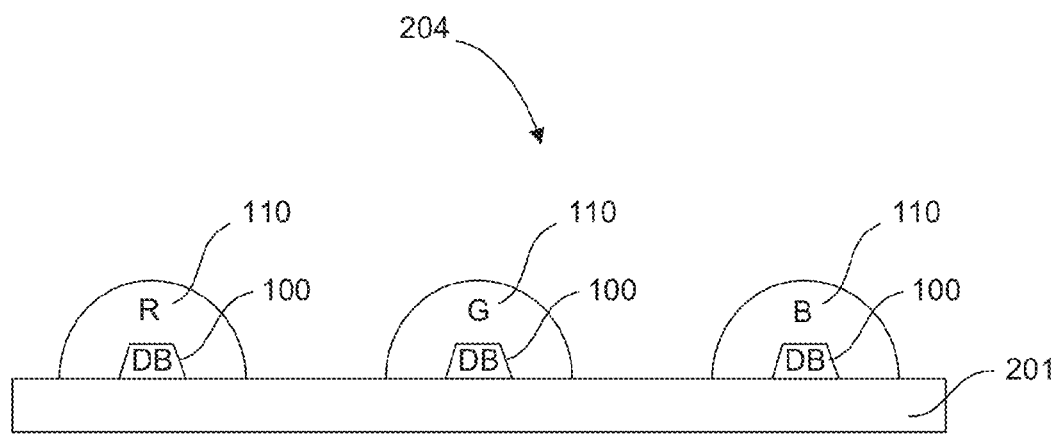
FIG. 2B is a schematic side view illustration of a pixel in accordance with an embodiment of the invention.

FIG. 2B is a schematic side view illustration of a pixel 204 in accordance with an embodiment of the invention. As illustrated in FIG. 2B, each micro LED device 100 is designed to emit a deep blue (DB) color spectrum. In such an embodiment, the different wavelength conversion layers 110 can be designed to emit red (R), green (G), and blue (B) in an RGB subpixel arrangement.

Figure 2C:
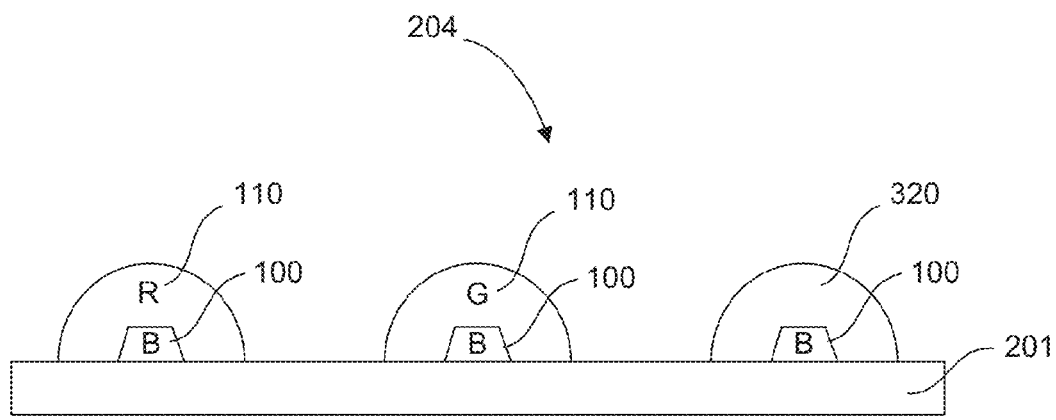
FIG. 2C is a schematic side view illustration of a pixel in accordance with an embodiment of the invention.

FIG. 2C is a schematic side view illustration of a pixel 204 in accordance with an embodiment of the invention. As illustrated in FIG. 2C, each micro LED device 100 is designed to emit a blue (B) color spectrum. In such an embodiment, the different wavelength conversion layers 110 can be designed to emit red (R) and green (G). Rather than depositing a wavelength conversion layer 110 over the third micro LED device 110, a transparent light distribution layer 320 can be formed. In this manner an RGB subpixel arrangement is achieved without having to covert the blue light from the blue emitting subpixel.

Figure 2D:
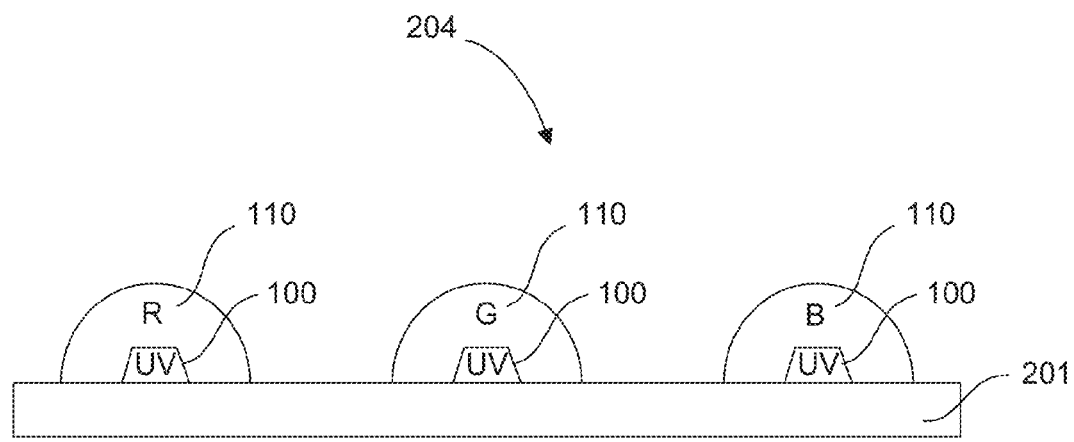
FIG. 2D is a schematic side view illustration of a pixel in accordance with an embodiment of the invention.

FIG. 2D is a schematic side view illustration of a pixel 204 in accordance with an embodiment of the invention. As illustrated in FIG. 2D, each micro LED device 100 is designed to emit an ultraviolet (UV) color spectrum. In such an embodiment, the different wavelength conversion layers 110 can be designed to emit red (R), green (G), and blue (B).

Figure 2E:
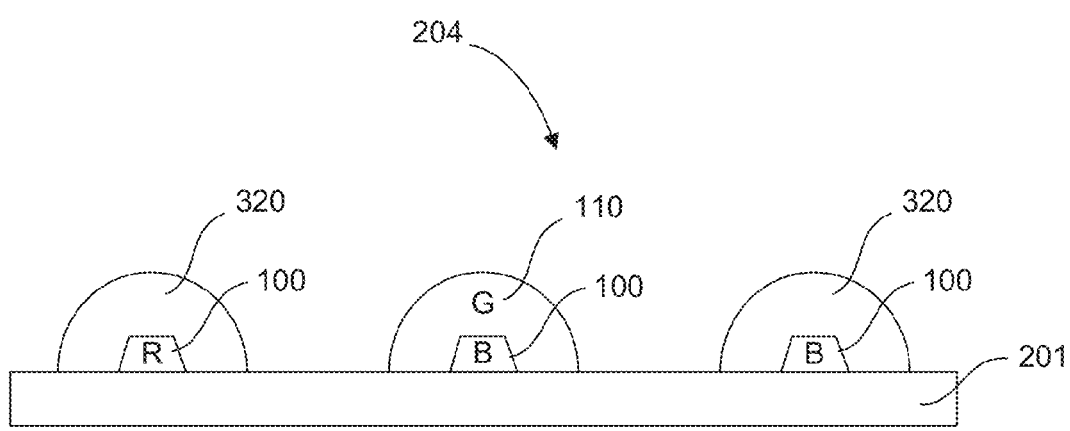
FIG. 2E is a schematic side view illustration of a pixel in accordance with an embodiment of the invention.

FIG. 2E is a schematic side view illustration of a pixel 204 in accordance with an embodiment of the invention. As illustrated in FIG. 2D, the pixel 204 includes micro LED devices 100 designed to emit a red (R) or blue (B) color emission spectrum. As illustrated, a green (G) emitting wavelength conversion layer 110 is formed around one of the blue emitting micro LED device 100, and a wavelength conversion layer 110 is not required to be formed over the red emitting micro LED device 110 or the other blue emitting micro LED device. A transparent light distribution layer 320 may optionally be formed over the naked red and blue emitting micro LED devices 110 that are not covered with a wavelength conversion layer 110. Such a configuration may be implemented, for example, when it is possible to fabricate and integrate blue emitting and red emitting micro LED devices that are more efficient than green emitting micro LED devices. In such an embodiment, it may be more efficient to convert blue light to green light with a wavelength conversion layer. Such a configuration may also be useful when providing a broad spectrum at the visual response peak, around 555 nm. Such a configuration may also be useful for increasing the color rendering index (CRI), for example by using a narrow red (or blue) emission spectrum from the micro LED device rather than a broader phosphor particle emission spectrum. Such a configuration may also allow for controlling the correlated control temperature (CCT) of the light emitting device, and hence controlling the warmth, without losing lumens due to conversion in the red spectrum.

In accordance with embodiments of the invention, the light emitting device configuration including the micro LED device and wavelength conversion layer can be incorporated into a variety of lighting or display devices. Exemplary lighting applications include interior or exterior lighting applications, such as billboard lighting, building lighting, street lighting, light bulbs, and lamps. Exemplary display applications include passive matrix display and active matrix displays, such as, display signage, display panels, televisions, tablets, phones, laptops, computer monitors, kiosks, digital cameras, handheld game consoles, media displays, ebook displays, or large area signage display.

Figure 3A:
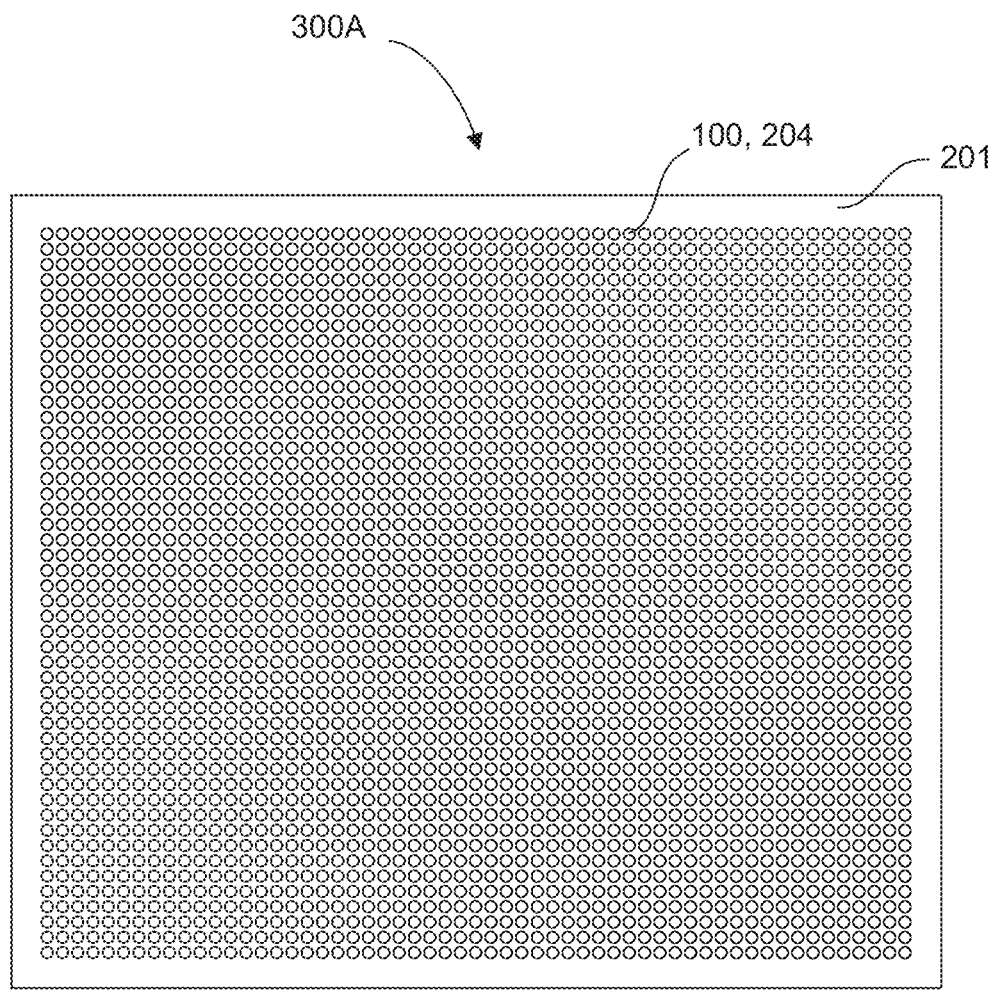
FIGS. 3A-3B are schematic top view illustrations of light emitting devices including a plurality of micro LED devices, or alternatively pixels of micro LED devices, and wavelength conversion layers in accordance with embodiments of the invention.
Figure 3B:
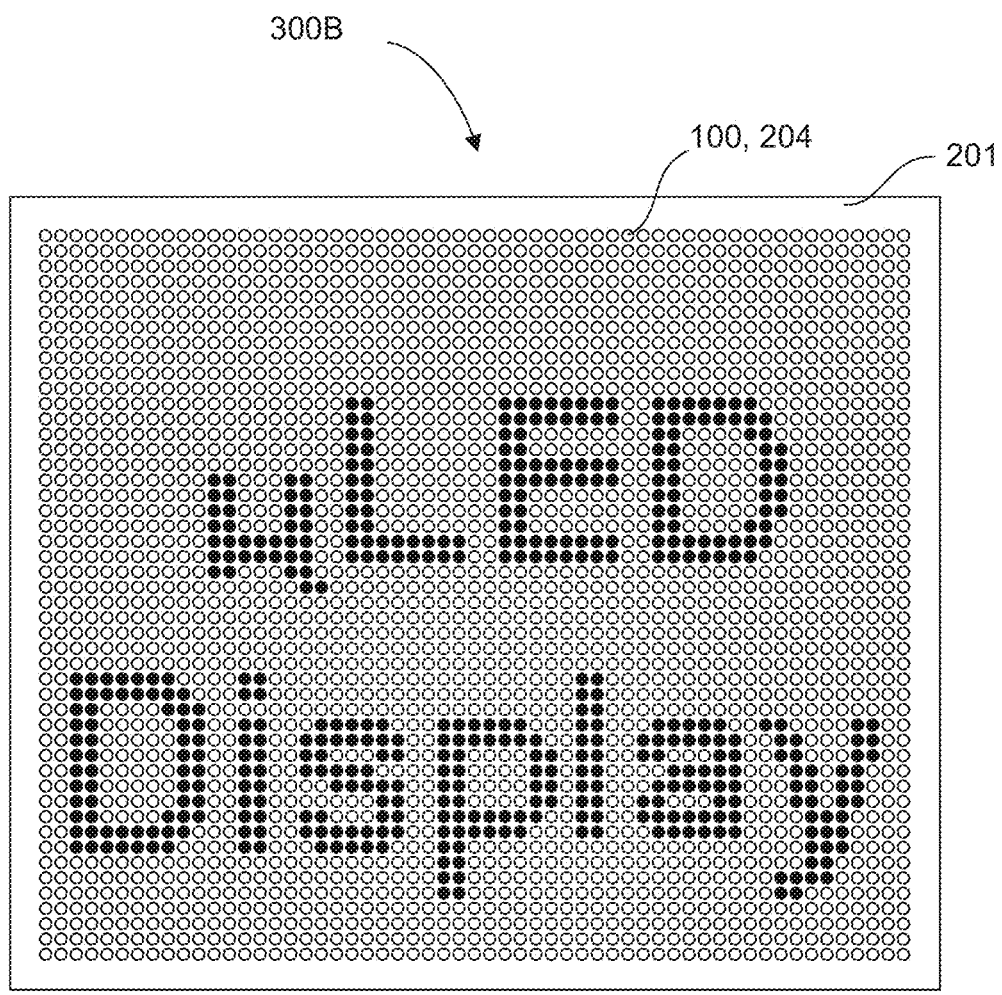

Referring now to FIGS. 3A-3B, schematic top view illustrations are provided of light emitting devices including a plurality of micro LED devices 100, or alternatively pixels 204 of micro LED devices, and wavelength conversion layers for controlling the light emission spectrum. In one embodiment, the light emitting device may be a lighting device 300A. For example, each of the micro LED devices 100 or pixels 204 can be addressed together. Alternatively, subsets of the pixels can be addressed together. For example, blue emitting subpixels can be addressed together, while red subpixels can be addressed together, and green emitting subpixels can be addressed together. In another example, different regions or shapes of micro LED devices 100 or pixels 204 can be addressed separately. In another embodiment, each micro LED device, subpixel, or pixel can be selectively addressed. Referring to FIG. 3B, such a configuration can also be used for a micro LED display 300B. Any arrangement of light emitting devices may be made in accordance with embodiments of the invention. For example, the micro LED devices can be arranged in arrays or irregular patterns for illumination. Each micro LED device may be simultaneously addressed, or selectively addressed depending upon application.

In the following description, specific examples are described and illustrated for integrating micro LED devices with wavelength conversion layers into lighting or display devices. It is to be appreciated, however, that the following embodiments are exemplary and are not intended to exclusive of one another, and that the following embodiments may be combined in certain situations.

Figure 4A:
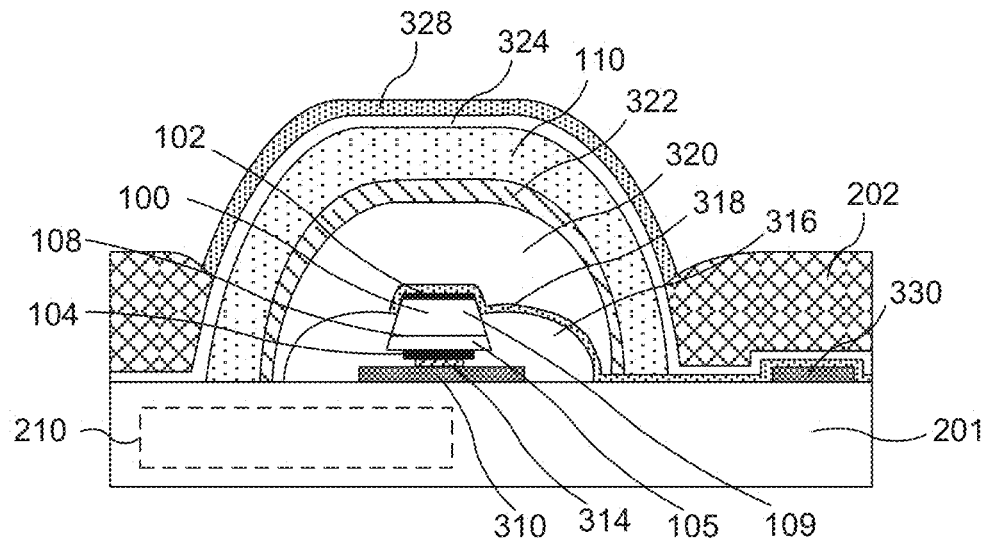
FIGS. 4A-4B are cross-sectional side view illustrations of a micro LED device and wavelength conversion layer in accordance with embodiments of the invention.

Referring now to FIGS. 4A-4D, various configurations for bonding a micro LED device onto a substrate 201 are described. Referring now to FIG. 4A, in an embodiment a micro LED device 100 is bonded to a bottom electrode 310 on or within a substrate 201. The micro LED device 100 can be transferred and bonded to the substrate 201 as part of an array of micro LED devices 100 using a variety of techniques including a transfer bonding process, transfer using elastomeric stamps, or transfer and bonding using an electrostatic transfer head array, as described in any of U.S. Pat.

No. 8,333,860, U.S. Pat. No. 8,349,116, U.S. Pat. No. 8,415,771, U.S. Pat. No. 8,415,767, or U.S. Pat. No. 8,415,768.

Substrate 201 may be a variety of substrates such as, but not limited to, a display substrate, a lighting substrate, a substrate with functional devices such as transistors or integrated circuits (ICs), or a substrate with metal redistribution lines. Depending upon the particular application, substrate 201 may be opaque, transparent, or semi-transparent to the visible wavelength spectrum (e.g. 380-750 nm wavelength), and substrate 201 may be rigid or flexible. For example, substrate 201 may be formed of glass, metal foil, metal foil covered with dielectric, or a polymer such as polyethylene terephthalate (PET), polyethylene naphthalate (PEN), polycarbonate (PC), polyethersulphone (PES), aromatic fluorine-containing polyarylates (PAR), polycyclic olefin (PCO), and polyimide (PI). In an embodiment, the substrate 201 includes working circuitry 210. For example substrate 201 may be an active matrix backplane including working circuitry 210 such as a driving transistor, switching transistor, and capacitor. In an embodiment, substrate 201 is a thin film transistor (TFT) substrate including working circuitry 210.

Conductive electrodes or electrode lines 310, 330 can be formed on, within, or over substrate 201. For example, the electrodes or electrode lines 310, 330 function as an anode, cathode or ground, or an electrical line to anode, cathode, or ground. In interests of clarity, 310 is referred to as a bottom electrode or electrode line and 330 is referred to as a ground line in the remainder of the description. However, it is to be appreciated that this is one embodiment, and other configurations are possible. While the remainder of the description is made with regard to this designation, it is understood that this is not the sole embodiment.

Bottom electrode 310 and ground line 330 can be formed of a variety of materials, and either may be opaque, transparent, or semi-transparent to the visible wavelength spectrum. Exemplary transparent conductive materials include amorphous silicon, transparent conductive oxides (TCO) such as indium-tin-oxide (ITO) and indium-zinc-oxide (IZO), carbon nanotube film, or a transparent conducting polymer such as poly(3,4-ethylenedioxythiophene) (PEDOT), polyaniline, polyacetylene, polypyrrole, and polythiophene. In an embodiment bottom electrode 310 is approximately 100 nm-200 nm thick ITO. In an embodiment, the bottom electrode 310 includes nanoparticles such as silver, gold, aluminum, molybdenum, titanium, tungsten, ITO, and IZO. The bottom electrode 310 or ground line 330 may also be reflective to the visible wavelength. In an embodiment, a bottom electrode 310 or ground line 330 comprises a reflective metallic film such as aluminum, molybdenum, titanium, titanium-tungsten, silver, or gold, or alloys thereof.

A bonding layer 314 may optionally be formed between the micro LED device 100 and the bottom electrode 310 to facilitate bonding of the bottom contact 104 of micro LED device 100 to the bottom electrode 310 on substrate 201. In an embodiment, bonding layer 314 includes a material such as indium, gold, silver, molybdenum, tin, aluminum, silicon, or an alloy or alloys thereof.

In the following embodiments description is made with regard to a specific vertical micro LED device 100 structure. It is to be appreciated, that the specific micro LED device 100 illustrated is exemplary and that embodiments of the invention are not limited. In the particular embodiment illustrated, the micro LED devices 100 include a micro p-n diode between a bottom contact 104 and top contact 102. In an embodiment, the micro p-n diode is several micros thick, such as 30 µm or less, or even 5 µm or less, with the top and bottom contacts 104, 102 being 0.1 µm-2 µm thick. The micro p-n diode may include a n-doped layer 109, a p-doped layer 105, and one or more quantum well layers 108 between the n-doped layer and p-doped layer. In the particular embodiment illustrated in FIG. 4A the n-doped layer 109 is illustrated as being above the p-doped layer 105. Alternatively, the p-doped layer 105 may be above the n-doped layer 109. The micro LED devices 100 may have straight or tapered sidewalls 106 (from top to bottom). The top and bottom contacts 102, 104 may include one or more layers and can be formed of a variety of electrically conducting materials including metals, conductive oxides, and conductive polymers. The top and bottom contacts 102, 104 may be transparent or semi-transparent to the visible wavelength spectrum (e.g. 380 nm-750 nm) or opaque. The top and bottom contacts 102, 104 may optionally include a reflective layer, such as a silver layer. Referring briefly back to FIG. 1A, in an embodiment, a conformal dielectric barrier layer 107 may optionally be formed along the sidewalls 106 of the p-n diode to electrically passivate the quantum well 108, and optionally along the top or bottom surface of the micro p-n diode. The conformal dielectric barrier layer 107 may be thinner than the p-n diode so that it forms an outline of the topography of the p-n diode it is formed on. For example, the conformal dielectric barrier layer 107 may be approximately 50-600 angstroms thick aluminum oxide.

Referring again to FIGS. 4A-4E, a sidewall passivation layer 316 can be formed around the sidewalls of the micro LED devices 100. In an embodiment where the micro LED devices 100 are vertical LED devices, the sidewall passivation layer 316 covers and spans the quantum well structure 108. In accordance with embodiments of the invention, the sidewall passivation layer 316 may be transparent or semi-transparent to the visible wavelength spectrum so as to not significantly degrade light extraction efficiency from sidewalls of the micro LED devices 100. Sidewall passivation layer 316 may be formed of a variety of materials such as, but not limited to epoxy, silicone, acrylic, poly(methyl methacrylate) (PMMA), benzocyclobutene (BCB), polyimide, and polyester. In an embodiment, sidewall passivation layer 316 is formed by ink jet printing around the light emitting devices 400, followed by curing. In an embodiment, sidewall passivation layer 316 is cured with ultraviolet (UV) light to minimize volume change as a result of cure and protect the integrity of the bond between the micro LED device and the bottom electrode, though thermal curing may also be performed. Sidewall passivation layer 316 can also be deposited using other techniques such as slit coating, physical vapor deposition or chemical vapor deposition of a dielectric material such as a nitride or oxide, spin on technique such as a spin on glass, or spray coating followed by solvent evaporation. In an embodiment, sidewall passivation layer is an a-staged or b-staged coating already formed over the substrate 201 prior to bonding the micro LED device 100, and the coating is then cured after bonding of the micro LED device 100. As described in further detail below, sidewall passivation layer 316 may also include fillers such as phosphor particles, pigment or dye, or scattering particles. In such an embodiment, UV cure may be used rather than thermal cure to avoid thermal degradation of the fillers, particularly for quantum dots.

In an embodiment the sidewall passivation layer 316 at least partially covers the bottom electrode 310. In the embodiments illustrated, the sidewall passivation layer completely covers the bottom electrode 310, however, this is not required. Any combination of other insulating layers can be used to electrically insulate the bottom electrode 310 from other electrically conductive layers. In accordance with embodiments of the invention, a sidewall passivation layer 316 may not be required where a conformal dielectric barrier layer 107 is present along sidewalls of the micro LED devices 100. Alternatively, a sidewall passivation layer 316 may be formed in combination with an existing conformal dielectric barrier layer 107.

Following the formation of optional sidewall passivation layer 316, a top electrode layer 318 is formed on the micro LED device 100 and in electrical contact with the top contact 102 and ground line 330. Depending upon the particular application in the following description, top electrode layer 318 may be opaque, reflective, transparent, or semi-transparent to the visible wavelength. Exemplary transparent conductive materials include amorphous silicon, transparent conductive oxides (TCO) such as indium-tin-oxide (ITO) and indium-zinc-oxide (IZO), carbon nanotube film, or a transparent conductive polymer such as poly(3,4-ethylene-dioxythiophene) (PEDOT), polyaniline, polyacetylene, polypyrrole, and polythiophene. In an embodiment top electrode layer 318 is approximately 50 nm-1 µm thick ITO-silver-ITO stack, with the silver layer thin enough to be transparent to the visible wavelength spectrum. In a particular embodiment, the top electrode layer 318 is formed by ink jet printing. In an embodiment top electrode layer 318 is approximately 50 nm-1 µm thick PEDOT. Other methods of formation may include chemical vapor deposition (CVD), physical vapor deposition (PVD), or spin coating depending upon the desired area to be coated and any thermal constraints. In accordance with embodiments of the present invention, the top electrode layer 318 may be formed over a plurality of the micro LED devices 100 on substrate 201, electrically connecting the plurality of the micro LED devices 100 to ground line 330.

Following the formation of top electrode layer 318, a light distribution layer 320 may optionally be formed over the micro LED device 100. In an embodiment, light distribution layer 320 is dome shaped. In an embodiment, a dome shape may create radial spreading of the light emitted from the micro LED device. In an embodiment, the dome shape profile is hemispherical. In other embodiments the dome shape profile can be flattened or narrowed. In an embodiment, the thickness and profile of the light distribution layer provides a base structure upon which a micro lens structure is formed in order to change the light emission beam profile from the micro LED device 100, as well as color over angle characteristics of the light emitting device which can be related to edge effects. Light distribution layer 320 may be formed of a variety of transparent materials such as epoxy, silicone, and acrylic, which have the following reported refractive indices (n) at nominal 590 nm wavelength: n=1.51-1.57 (epoxy), n=1.38-1.58 (silicone), n=1.49 (acrylic). In an embodiment, light distribution layer 320 is formed by ink jet printing. In an embodiment, the light distribution layer 320 is formed by application of a molten glass droplet. Glass compositions can range from a variety of compositions ranging from acrylic grass, crown glass, flint glass, and borosilicate glasses that possess indices of refraction that can be matched to those of epoxy, silicone, or acrylic above. The light distribution layer 320 may be thicker than the micro LED device 100. In an embodiment, the light distribution layer 320 is 1 µm-100 µm thick.

In accordance with embodiments of the invention, the light distribution layer 320 may allow the light emitted from the micro LED device 100 to spread out prior to entering the wavelength conversion layer 110, and also decrease the optical intensity of light entering the wavelength conversion layer (and color filter). In one aspect, the spread out light may result in more even emission from the wavelength conversion layer 110 to be formed over the transparent light distribution layer 320. In another aspect, reduction of the optical density may reduce thermal degradation of the phosphor particles in wavelength conversion layer, prolonging lifetime of the light emitting device. In yet another aspect, spreading out of the light and reduction of the optical intensity may reduce the amount of back reflection from the wavelength conversion being that is reabsorbed by the micro LED device 100. In accordance with embodiments of the invention, inclusion of the light distribution layer 320 may increase total light emission, increase emission uniformity, and increase sharpness of the color spectrum for the light emitting device. The thickness and profile of the light distribution layer may also provide a base structure upon which a micro lens structure is formed in order to change the light emission beam profile from the micro LED device 100, as well as color over angle characteristics of the light emitting device which can be related to edge effects.

Following the formation of the optional light distribution layer 320, a matching layer 322 may optionally be formed over the light distribution layer 320 prior to forming the wavelength conversion layer 110. The matching layer 322 may function to match the indices of refraction for the light distribution layer 320 and wavelength conversion layer 110 to reduce back reflection of light. For example, where layers 320, 110 are formed of, for example, an epoxy, silicone, acrylic, or glass having different indices of refraction, the matching layer 322 is formed of an epoxy, silicone, acrylic, or glass having an index of refraction between that of layers 320, 110. In accordance with embodiments of the invention, the polymer matrix forming layers 320, 110 is the same, and layers 320, 110 have an identical index of refraction. In another embodiment, the index of refraction for layers 320, 110 is within 0.3, or more particularly within 0.1. In an embodiment, matching layer is 2 µm or less in thickness. In an embodiment, curing of the matching layer 322 may be thermal or UV.

In accordance with embodiments of the invention, a wavelength conversion layer 110 is formed around the micro LED device 100, and around the optional light distribution and matching layers, if present. In an embodiment, the wavelength conversion layer 110 is formed of phosphor particles. For example, the wavelength conversion layer is formed of a spray deposition method followed by removal of solvents. In an embodiment, the wavelength conversion layer includes a dispersion of phosphor particles in a matrix material such as a polymer or glass matrix material. Other filler materials such as pigment, dye, or scattering particles may also be dispersed within the matrix, or among the phosphor particles themselves if no matrix material is present. In an embodiment, wavelength conversion layer 110 is formed by ink jet printing, and UV cured. In an embodiment, the wavelength conversion layer 110 is formed by application of a molten glass droplet, where the fillers are thermally and chemically stable within the molten glass droplet. The thickness of the wavelength conversion layer 110, as well a concentration of fillers, e.g. phosphor particles, pigment, dye, or light scattering particles are tuned to achieve the requisite color spectrum. For example, minimized color bleeding from the micro LED device through the wavelength conversion layer, and maximized emission from the phosphor particles. Thickness of the wavelength conversion layer 110 (as well as optional light distribution layer 320)

may also be partly determined by the spacing between micro LED devices. For example, micro LED devices may be spaced more closely together in high resolution display applications compared to lighting applications. In an embodiment, the wavelength conversion layer 110 is 5 µm-100 µm thick, or more specifically 30 µm-50 µm thick for an exemplary 5 µm wide and 3.5 µm tall micro LED device 100. In some embodiments, the thickness of the wavelength conversion layer and concentration of fillers may be designed to allow some light from the micro LED device 100 to pass through resulting a mix of the micro LED device light spectrum and the converted light spectrum to achieve a blended emission spectrum, for example, white light. Concentration of the color converting materials (e.g. phosphor particles, pigment, dye) as well as thickness of the layers can depend upon the particular application of the light emitting device, for example, if full color conversion (e.g. from blue to red, or blue to green, etc.) is to occur, of leakage or bleeding of light from the underlying micro LED device is to occur, or if a mixture of converting materials is employed. In an embodiment where full color conversion (e.g. from blue to red, or blue to green, etc.) occurs a volume loading percent of greater than 50% color converting materials may be included in the wavelength conversion layer. In an embodiment, the wavelength conversion layer includes greater than 50% volume loading of phosphor particles.

In accordance with some embodiments of the invention, the polymer matrix forming the wavelength conversion layer 110 may be permeable to oxygen or moisture. In an embodiment, following the formation of the wavelength conversion layer 110, an oxygen barrier film 324 may optionally be formed in order to protect the wavelength conversion layer 110 from oxygen or moisture absorption. For example, where wavelength conversion layer 110 includes quantum dots, the oxygen barrier film 324 can act as a barrier to oxygen or moisture absorption by the quantum dots, thereby prolonging the lifetime of the quantum dots in the lighting or display device. Suitable materials for the oxygen barrier film 324 include, but are not limited to, $Al_2O_3$, $SiO_2$, $SiN_x$, and glass. The deposition method for oxygen barrier film 324 may be a low temperature method in order to not thermally degrade the quantum dots or other fillers. Exemplary conformal deposition methods include atomic layer deposition (ALD), sputtering, spin on, and lamination. The oxygen barrier film may also be blanket deposited over the entire substrate, or over all of the micro LED devices. In an embodiment, an $Al_2O_3$ oxygen barrier film is deposited by atomic layer deposition (ALD).

Referring briefly back to FIG. 2A a black matrix (or alternatively white matrix) material 202 is illustrated between the micro LED devices 100 in order to block light transmission, and to separate bleeding of light between adjacent micro LED devices 100. Black (or white) matrix 202 can be formed from a method that is appropriate based upon the material used, and composition of layers already formed. Manner of formation may also be determined by whether the black (or white) matrix is formed in a single side manner (see FIG. 5) or a top press down manner (see FIG. 6). For example, black (or white) matrix 202 can be applied using ink jet printing, sputter and etching, spin coating with lift-off, or a printing method. In some embodiments, black (or white) matrix 202 is formed by ink jet printing and UV cured in order to not thermally degrade the phosphor particles in a wavelength conversion layer 110 already formed. Exemplary black matrix materials include carbon, metal films (e.g. nickel, aluminum, molybdenum, and alloys thereof), metal oxide films (e.g. chromium oxide), and metal nitride films (e.g. chromium nitride), organic resins, glass pastes, and resins or pastes including a black pigment or silver particles. Exemplary white matrix materials include metal particles or $TiO_2$ particles loaded win a polymer, organic resin, or glass paste, for example. In the embodiments illustrated in FIGS. 4A-5, a black (or white) matrix 202 is formed on the substrate 201 in a single side manner—prior to forming a cover over the light emitting device. In the embodiment illustrated in FIG. 6, the black (or white) matrix material can be formed in a top press down manner—in which the black (or white) matrix is formed on the cover prior attaching to the substrate 201.

A color filter layer 328 may optionally be formed over the wavelength conversion layer 110 to filter out colors emitting through the wavelength conversion layer 110 other than those desired and sharpen the emission spectrum of the light emitting device. By way of example, a red color filter layer 328 may be placed over a wavelength conversion layer 110 including red emitting phosphor particles in order to filter out colors other than red, a green color filter layer 328 may be placed over a wavelength conversion layer 110 including green emitting phosphor particles in order to filter out colors other than green, and a blue color filter layer 328 may be placed over a wavelength conversion layer 110 including blue emitting phosphor particles in order to filter out colors other than blue. Referring back to FIG. 2B, in an embodiment, a blue color filer may not be necessary over a blue wavelength conversion layer 110 wherein the underlying micro LED device 100 is deep blue emitting. Referring back to FIG. 2C, in an embodiment, a blue color filer may not be necessary over naked (e.g. no wavelength conversion layer) blue emitting underlying micro LED device 100. It is to be appreciated that these configurations are exemplary and a variety of configurations are possible depending upon desired light emission spectrum. Suitable materials for the color filter include pigments or dyes as previously described above. In an embodiment, color filter layer 328 includes a pigment or dye dispersed in a transparent matrix material. In an embodiment, the matrix material is the same polymer used for the wavelength conversion layer 110, such as epoxy, silicone, or acrylic. Likewise, the color filter may be formed using similar techniques, such as ink jet printing with UV cure. In an embodiment, the wavelength conversion layer 110 has an index of refraction within 0.3, or more particularly within 0.1, of the index of refraction for the wavelength conversion layer 110. In the embodiments illustrated in FIGS. 4A-4D the color filter layer 328 is formed after the black matrix 202. In other embodiments, the color filter layer 328 is formed before the black matrix 202.

Referring now to FIG. 4A, in one embodiment, a wavelength conversion layer 110 is formed after the formation of a light distribution layer 320. In the embodiment illustrated, both layers 110, 320 are formed around the micro LED device 100 both laterally and over. In this manner, light emission above the substrate 201 and through layers 110, 320 is increased. In the embodiment illustrated the passivation layer 316 also covers the bottom electrode 310 in order to prevent electrical shorting between the top electrode layer 318 and bottom electrode 310.

Figure 4B:
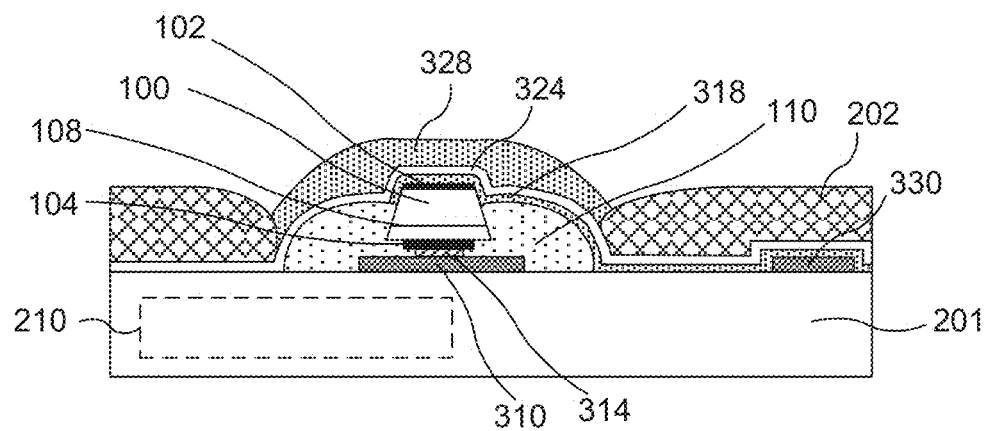

Up until this point the passivation layer 316 and wavelength conversion layer 110 have been described as separate layers. However, in some embodiments the wavelength conversion layer 110 can also function as a passivation layer. Referring now to FIG. 4B, in an embodiment wavelength conversion layer 110 spans along sidewalls of the micro LED device 110 and also covers the bottom electrode 310 to prevent electrical shorting with the top electrode layer 318.

In such an embodiment, the wavelength conversion layer 110 may not completely cover the top contact 102. In an embodiment, top contact 102 may include a reflective layer to reduce top emission from the micro LED device 100.

It is to be appreciated that while FIGS. 4A-4B are illustrated separately, that certain features of the two embodiments can be combined. For example, the passivation layer 316 of FIG. 4A can alternatively be a wavelength conversion layer 110, including the same fillers, such as phosphor particles, pigments, or dye.

Figure 4C:
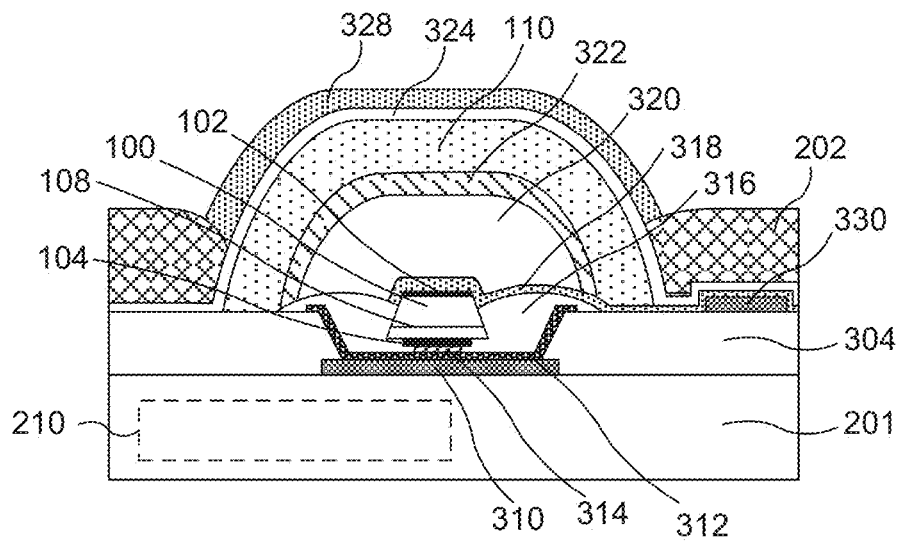
FIGS. 4C-4D are cross-sectional side view illustrations of a micro LED device within a reflective bank structure, and wavelength conversion layer in accordance with embodiments of the invention.
Figure 4D:
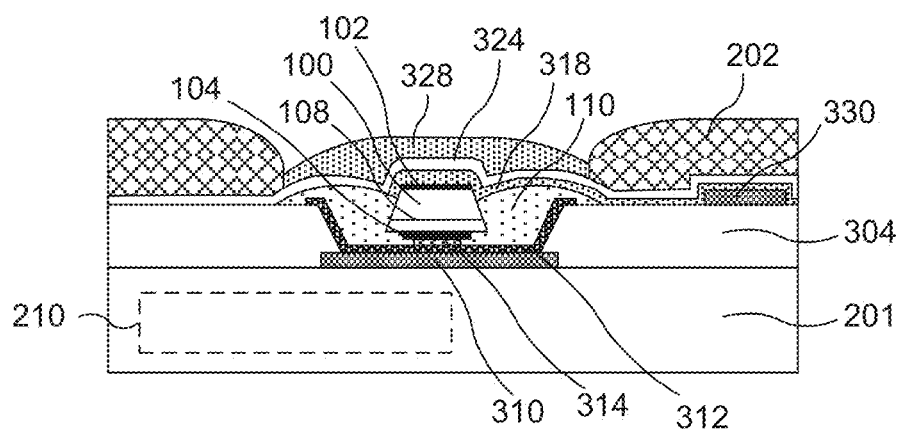

Referring now to FIGS. 4C-4D, in an embodiment the micro LED devices 100 are placed within reflective bank structures. In such an embodiment, a patterned bank layer 304 can be formed over the substrate, and a reflective layer 312 formed within the openings and along sidewalls of the openings of the patterned bank layer 304. In this manner, light emitting laterally from the micro LED devices 100 can be reflected out and through the layers designed to tailor color emission (e.g. 110, 328) rather than being absorbed by the black matrix 202 or other layers. In addition, back reflection of light from overlying layers such as the wavelength conversion layer 110 is not absorbed by the substrate and instead reflected out of the light emitting device. The patterned reflective layer may additionally increase efficiency of the phosphor particles, since they emit light in all directions, light that is emitted downward can be reflected out of the light emitting device.

In an embodiment, patterned bank layer 304 is formed of an insulating material and may be formed by a variety of techniques such as lamination, spin coating, CVD, and PVD. Patterned bank layer 304 may be may be opaque, transparent, or semi-transparent to the visible wavelength. Patterned bank layer 304 may be formed of a variety of materials such as, but not limited to, photodefinable acrylic, photoresist, silicon oxide ($SiO_2$), silicon nitride ($SiN_x$), poly(methyl methacrylate) (PMMA), benzocyclobutene (BCB), polyimide, acrylate, epoxy, and polyester. In an embodiment, patterned bank layer is formed of an opaque material such as a black matrix material. The patterned bank layer openings may be formed using a suitable technique such as lithography, and may expose the bottom electrode 310.

A reflective layer 312 is then formed over the patterned bank layer 304 and within the openings spanning the sidewalls and bottom surface of each of the openings. The reflective layer may be electrically conducting. In an embodiment, the reflective layer 312 functions as the bottom electrode and a separate bottom electrode 310 is not required. The reflective layer 312 may be formed of a number of conductive and reflective materials, and may include more than one layer. In an embodiment, a reflective layer 312 comprises a metallic film such as aluminum, molybdenum, titanium, titanium-tungsten, silver, or gold, or alloys thereof. The reflective layer 312 may also include a conductive material which is not necessarily reflective, such as amorphous silicon, transparent conductive oxides (TCO) such as indium-tin-oxide (ITO) and indium-zinc-oxide (IZO), carbon nanotube film, or a transparent conducting polymer such as poly(3,4-ethylenedioxythiophene) (PEDOT), polyaniline, polyacetylene, polypyrrole, and polythiophene. In an embodiment, the reflective layer includes a stack of a conductive material and a reflective conductive material. In an embodiment, the reflective layer includes a 3-layer stack including top and bottom layers and a reflective middle layer wherein one or both of the top and bottom layers are transparent. In an embodiment, the reflective layer includes a conductive oxide-reflective metal-conductive oxide 3-layer stack. The conductive oxide layers may be transparent. For example, the reflective layer 312 may include an ITO-silver-ITO layer stack. In such a configuration, the top and bottom ITO layers may prevent diffusion and/or oxidation of the reflective metal (silver) layer. In an embodiment, the reflective layer includes a Ti—Al—Ti stack. In an embodiment, the reflective layer includes an ITO-Ti—ITO stack. In an embodiment, the reflective layer includes an ITO-Ti—Al—Ti—ITO stack. In an embodiment, the reflective layer is 1 µm or less in thickness. The reflective layer may be deposited using a suitable technique such as, but not limited to, PVD.

Referring to FIG. 4C, in the embodiment illustrated the sidewall passivation layer 316 spans sidewalls of the micro LED device 100 and covers the quantum well structure 108. In the embodiment illustrated the sidewall passivation layer 316 also covers the bottom surface of the reflective layer 312. The sidewall passivation layer 316 may also cover the reflective layer 312 on top of the patterned bank layer 304, however, this may also be aided by the formation of an intermediate insulating material. As shown, the sidewall passivation layer 316 functions in part to electrically insulate the top electrode layer 318 from the reflective layer 312.

Referring now to the light distribution layer 320, in the embodiment illustrated in FIG. 4C, the light distribution layer 320 is wider than the opening in the patterned bank layer 304 in which the micro LED device 100 is bonded. Likewise, the wavelength conversion layer is wider than the opening in the patterned bank layer 304. Such a configuration may be used to ensure that light emitting above substrate 201 passes through the layers designed to tailor color emission (e.g. 110, 328). In an embodiment, top contact 102 includes a reflective layer. Where top contact 102 is reflective, light emission from the micro LED device 100 will become largely dependent upon sidewall emission. A reflective top contact 102 may additionally reduce the amount of back reflection of light from overlying layers that is absorbed by the micro LED device. In addition, the reflective top contact 102 may increase efficiency of the phosphor particles, since they emit light in all directions, light that is emitted downward can be reflected out of the light emitting device.

Similar to FIG. 4B described above, it is not required that the passivation layer 316 and wavelength conversion layer 110 are separate layers. In some embodiments the wavelength conversion layer 110 can also function as a passivation layer. Referring now to FIG. 4D, in an embodiment wavelength conversion layer 110 spans along sidewalls of the micro LED device 110 and also covers the bottom surface of the reflective layer 312 to prevent electrical shorting with the top electrode layer 318. Other insulating materials may also be formed to insulate the reflective layer 312 from the top electrode layer 318. In the embodiment illustrated in FIG. 4D, the wavelength conversion layer 110 may not completely cover the top contact 102. Top contact 102 may also include a reflective layer as previously described. It is to be appreciated that while FIGS. 4C-4D are illustrated separately, that certain features of the two embodiments can be combined. For example, the passivation layer 316 of FIG. 4C can alternatively be a wavelength conversion layer 110.

Figure 4E:
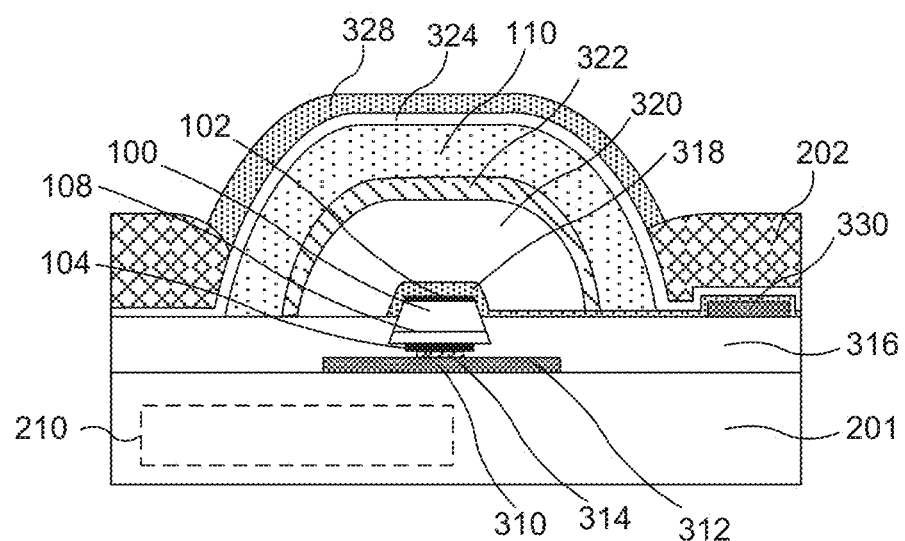
FIG. 4E is cross-sectional side view illustration of a micro LED device and wavelength conversion layer in accordance with an embodiment of the invention.

Referring now to FIG. 4E in one embodiment, sidewall passivation layer 316 can also be deposited using techniques such as slit coating, physical vapor deposition or chemical vapor deposition of a dielectric material such as a nitride or oxide, spin on technique such as a spin on glass, or spray coating followed by solvent evaporation. In an embodiment, sidewall passivation layer is an a-staged or b-staged coating already formed over the substrate 201 prior to bonding the micro LED device 100, and the coating is then cured after bonding of the micro LED device 100. In the embodiment illustrated the sidewall passivation layer 316 has an uppermost level top surface that does not extend above a top surface of the micro LED device 100.

Figure 5:
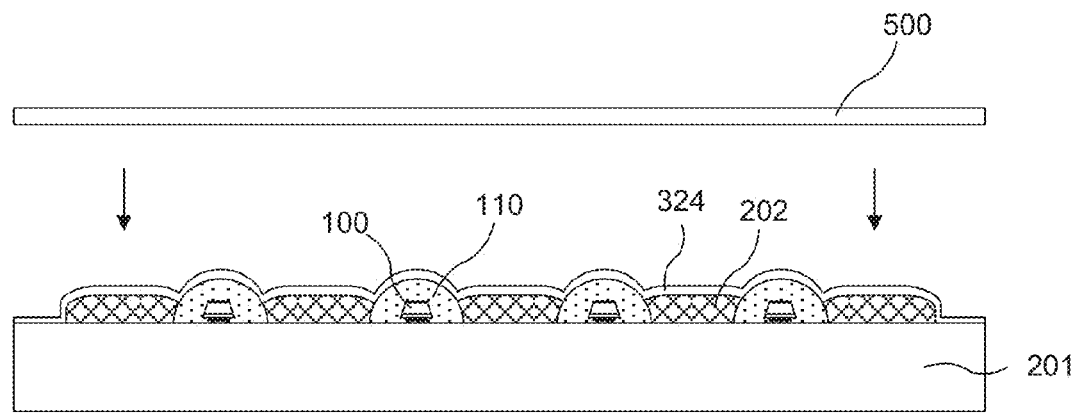
FIG. 5 is an illustration of a single side manner for applying wavelength conversion layers and a black matrix between micro LED devices in accordance with an embodiment of the invention.
Figure 6:
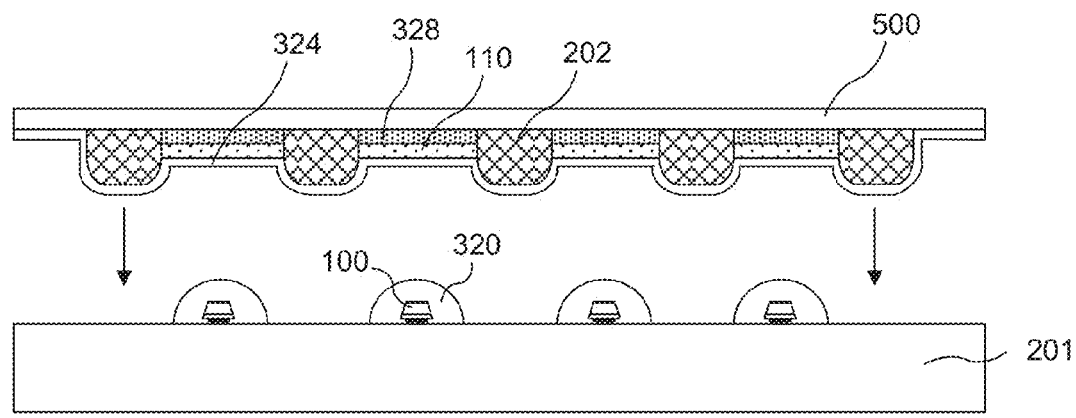
FIG. 6 is an illustration of a top press down manner for applying wavelength conversion layers and a black matrix between micro LED devices in accordance with an embodiment of the invention.

Referring now to FIGS. 5-6, alternative cover designs are described and illustrated for packaging the light emitting devices in accordance with embodiments. FIG. 5 is an illustration a single side fabrication manner for applying wavelength conversion layers and a black (or white) matrix between micro LED devices in accordance with an embodiment. As illustrated, the wavelength conversion layers 110 and matrix 202 are formed on substrate 201 prior to applying a cover 500 over the light emitting device. Top cover 500 can be rigid or flexible, and can be applied in a variety of manners. In an embodiment, top cover 500 is a transparent plastic material and is laminated onto the light emitting device. In an embodiment, top cover 500 is a rigid glass plate that is applied over the light emitting device configuration, and sealed around the peripheral edges of the substrate 201 with a sealant. A getter material may optionally be placed inside the sealed region containing the micro LED devices and the wavelength conversion layer 110 to absorb moisture, particularly if the wavelength conversion layer includes quantum dots.

FIG. 6 is an illustration of a top press down manner for applying wavelength conversion layers and a black (or white) matrix between micro LED devices in accordance with an embodiment. In the embodiment illustrated in FIG. 6, the matrix 202, wavelength conversion layer 110, oxygen barrier film 324, and optional color filter layer 328 are formed on the top cover 500 and pressed down over the array of micro LED devices 100. In such an embodiment, the sidewall passivation layer 316, top electrode layer 318 and optional transparent light distribution layer 320 are formed on the substrate 201. In an embodiment, the top cover 500 of FIG. 6 is a rigid glass plate, and is sealed around the peripheral edges of the substrate 201 with a sealant. A getter material may optionally be placed inside the sealed region containing the micro LED devices and the wavelength conversion layer 110 to absorb moisture, particularly if the wavelength conversion layer includes quantum dots. Either of the top cover configurations of FIGS. 5-6 can be used when forming the lighting or display devices described and illustrated herein.

Figure 7:
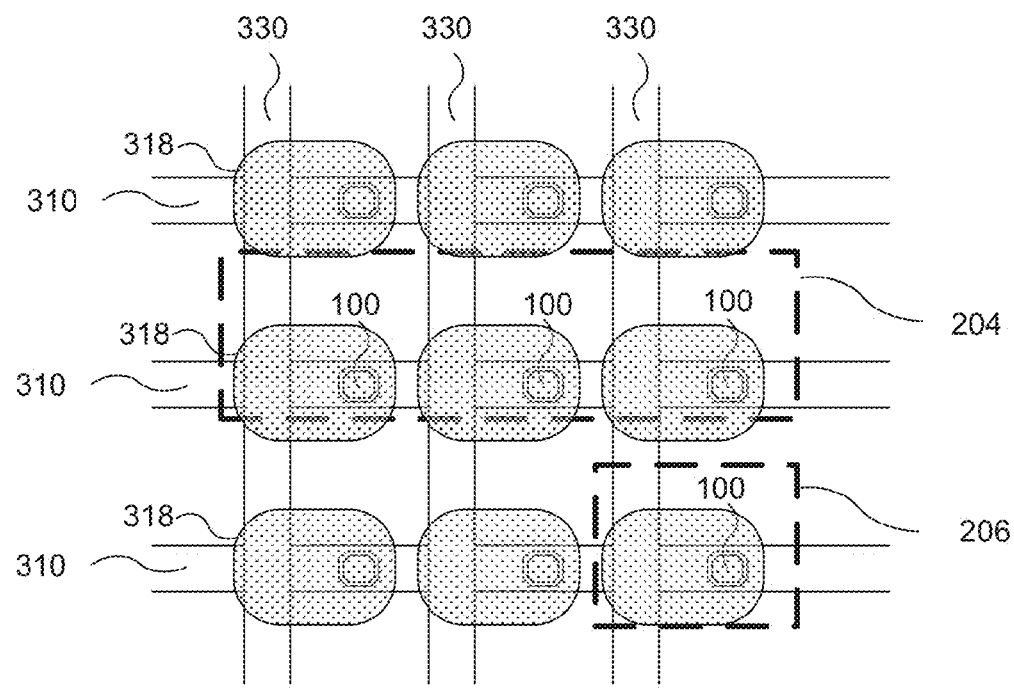
FIGS. 7-11 are top view schematic illustrations for various electrode configurations for lighting or display applications in accordance with embodiments of the invention.

Referring now to FIGS. 7-11 top view schematic illustrations are provided for various electrode configurations for lighting or display applications. It is to be appreciated, that the configurations are exemplary and that embodiments of the invention may be practiced using other configurations for incorporating micro LED devices and wavelength conversion layers into light emitting devices. Referring now to FIG. 7, in an embodiment a plurality of micro LED devices 100 are bonded to bottom electrode lines 310. In the embodiment illustrated, ground lines 330 run perpendicular to the bottom electrode lines 310, separated by an insulating layer. Alternatively, the ground lines 330 and bottom electrode lines 310 are parallel to one another. In an embodiment, individual top electrode layers 318 can be formed over the micro LED devices 100 connecting the micro LED devices 100 to ground lines 330. In other embodiments, a single top electrode layer 318 can connect a plurality of micro LED devices 100 to a single ground line 318. Depending upon the particular application, the lighting or display device may include an array of pixels 204. In the particular embodiment, illustrated each pixel 204 includes three sub-pixels 206, though such an arrangement is exemplary.

Figure 8:
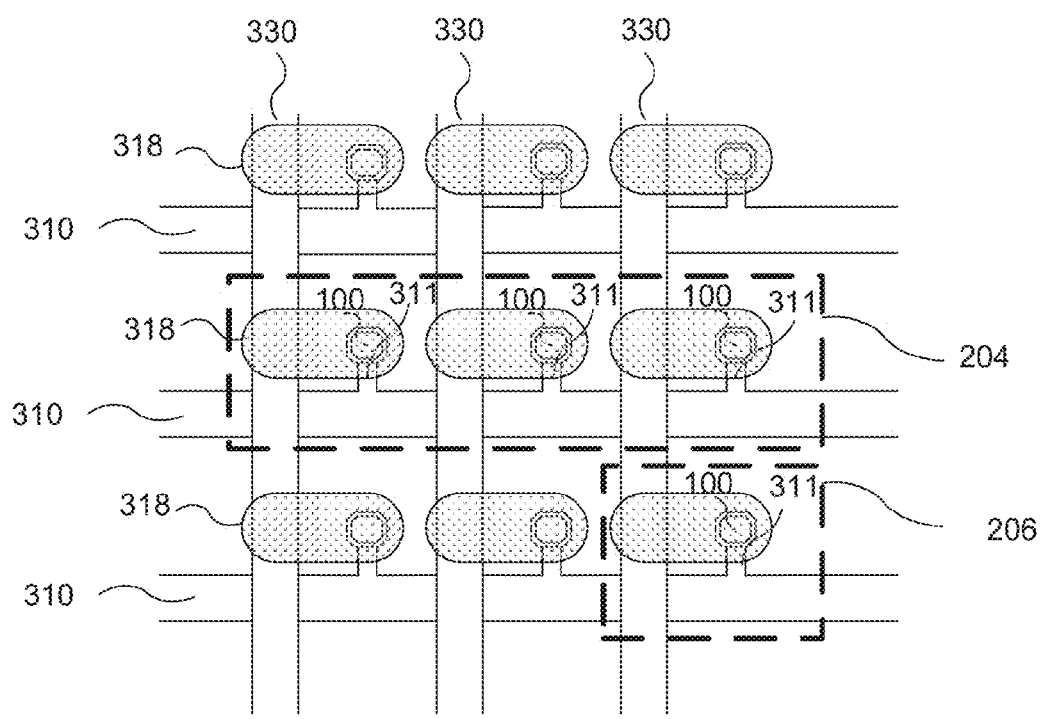

Referring to FIG. 8, in an embodiment, the micro LED devices 100 are bonded to electrode electrode traces 311 connected with a bottom electrode line 310. Such a configuration may be suitable for reducing likelihood of shorting between the ground line 330 and bottom electrode line 310 with the top electrode layers 318. In an embodiment, individual top electrode layers 318 can be formed over the micro LED devices 100 connecting the micro LED devices 100 to ground lines 330. In other embodiments, a single top electrode layer 318 can connect a plurality of micro LED devices 100 to a single ground line 318.

Figure 9:
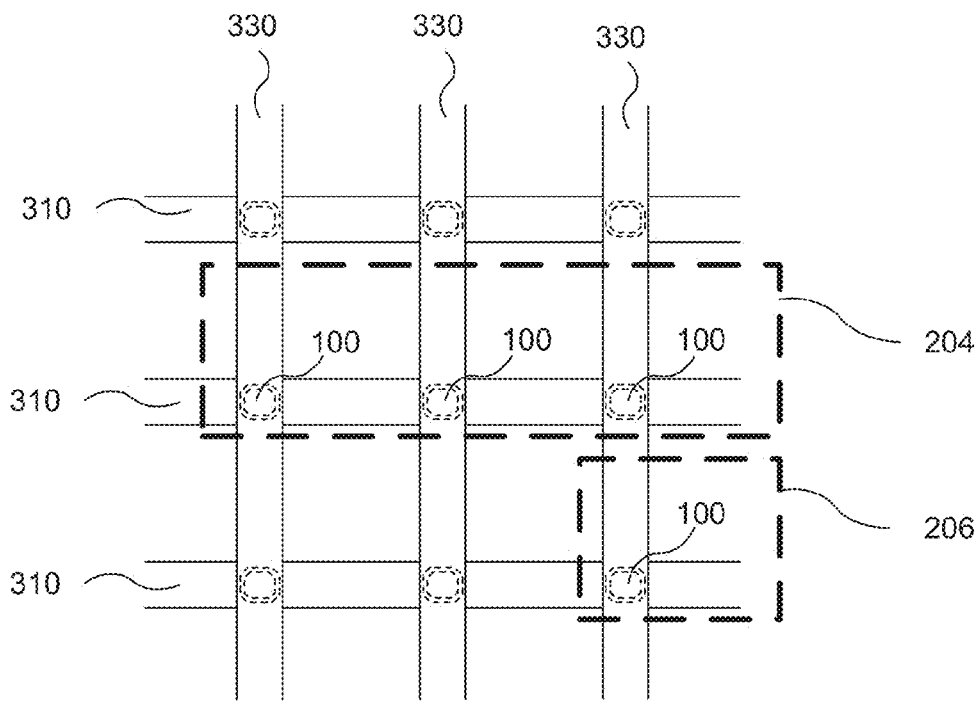

Referring to FIG. 9, in an embodiment, micro LED devices 100 are placed on the bottom electrode lines 310, and the ground lines 330 are formed over the micro LED devices 100, removing the requirement to form top electrode lines 310 to connect the micro LED devices to the ground lines 330. In this manner, the ground lines 330 are also the top electrode lines. In an embodiment, a plurality of ground lines 330 are formed over rows or columns of micro LED devices. In other embodiments, a single ground plane 330 is formed over a plurality of rows/columns of micro LED devices.

Figure 10:
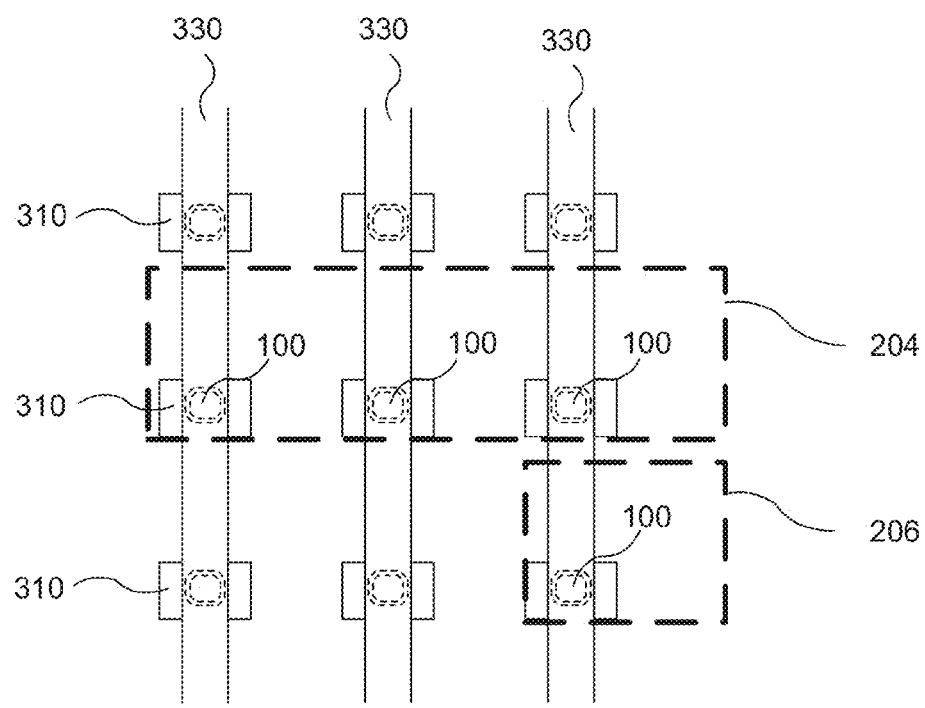
Figure 11:
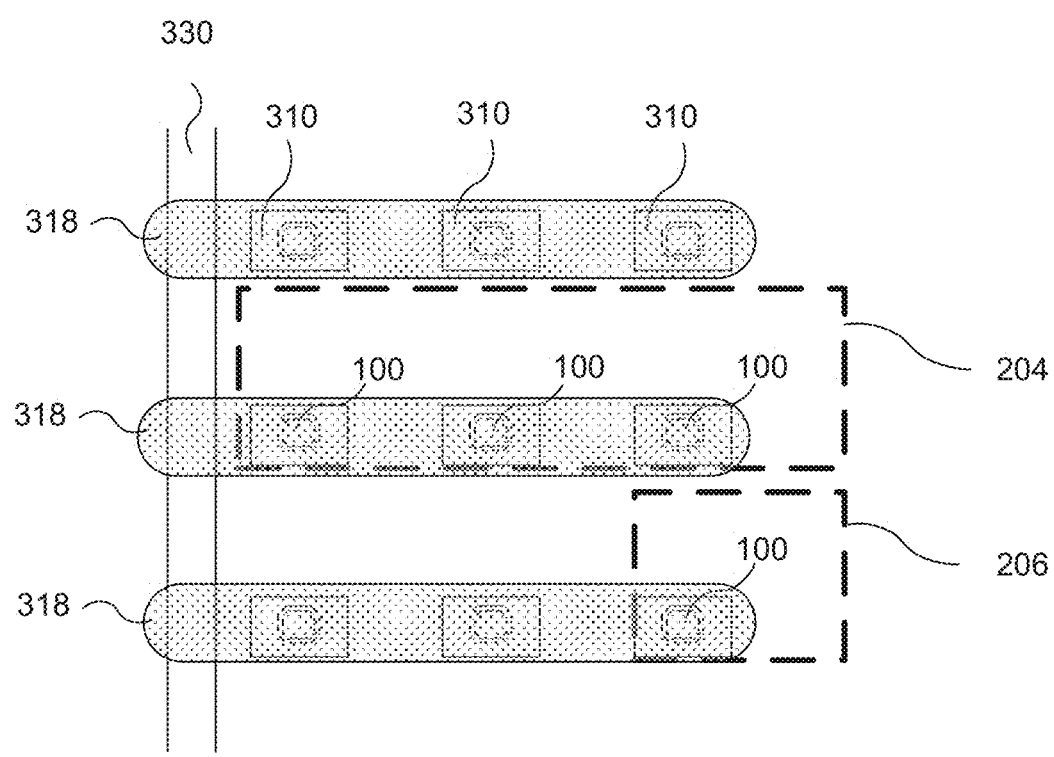

FIGS. 10-11 differ from the embodiments illustrated in FIGS. 7-9 in that the bottom electrodes 310 are in the form of separate pads. For example, rather than applying an operating current through an end of an electrode line, the operating current can be applied from below, which may be an electrode line or alternative working circuitry such as TFT circuitry. In this manner, it may be possible to address micro LED devices 100 individually rather in rows or columns. In the embodiment illustrated in FIG. 10 the micro LED devices are placed on the bottom electrodes 310, and the ground lines 330 are formed over the micro LED devices, removing the requirement to form top electrode lines 310 to connect the micro LED devices to the ground lines 330. In this manner, the ground lines 330 are also the top electrode lines. In an embodiment, a plurality of ground lines 330 are formed over rows or columns of micro LED devices. In other embodiments, a single ground plane 330 is formed over a plurality of rows/columns of micro LED devices. In the embodiment illustrated in FIG. 11 the micro LED devices are placed on the bottom electrodes 310, and the top electrode layer 318 connect the micro LED devices to one or more ground lines 330. In an embodiment, a single top electrode layer 318 connects a single micro LED device 100 to a single ground line 330. In an embodiment, a single top electrode layer 318 connects a row or column of micro LED devices 100 to a ground line 330. In an embodiment, a top electrode layer 318 is formed over a plurality of rows/columns of micro LED devices to connect the plurality of micro LED devices to a ground line 330.

Figure 12:
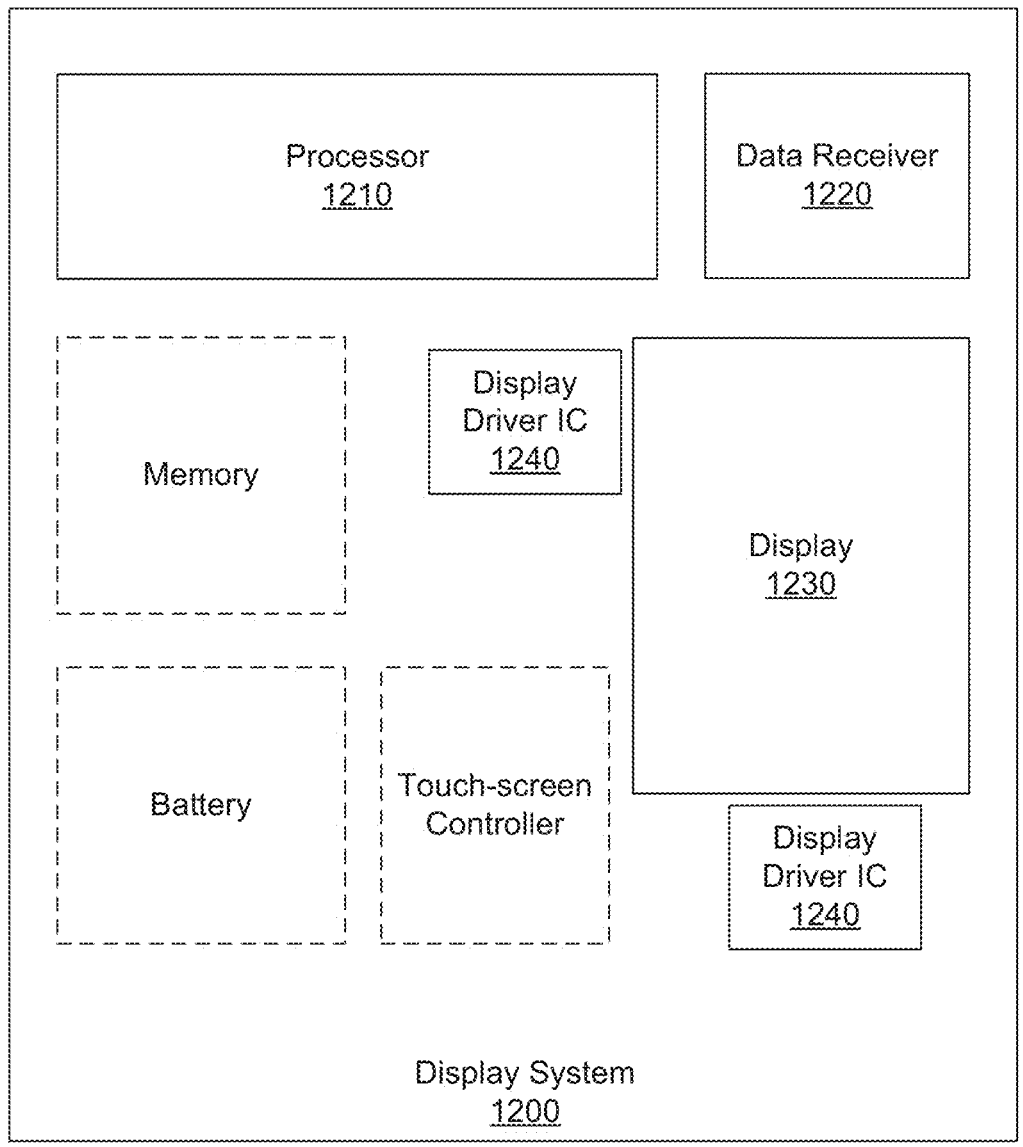
FIG. 12 is a schematic illustration of a display system in accordance with an embodiment of the invention.

FIG. 12 illustrates a display system 1200 in accordance with an embodiment. The display system houses a processor 1210, data receiver 1220, a display 1230, and one or more display driver ICs 1240, which may be scan driver ICs and data driver ICs. The data receiver 1220 may be configured to receive data wirelessly or wired. Wireless may be implemented in any of a number of wireless standards or protocols including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The one or more display driver ICs 1240 may be physically and electrically coupled to the display 1230.

In some embodiments, the display 1230 includes one or more micro LED devices 100 that are formed in accordance with embodiments of the invention described above. For example, the display 1230 may include a plurality of micro LED devices and a plurality of wavelength conversion layers around the micro LED devices.

Depending on its applications, the display system 1200 may include other components. These other components include, but are not limited to, memory, a touch-screen controller, and a battery. In various implementations, the display system 1200 may be a television, tablet, phone, laptop, computer monitor, kiosk, digital camera, handheld game console, media display, ebook display, or large area signage display.

Figure 13:
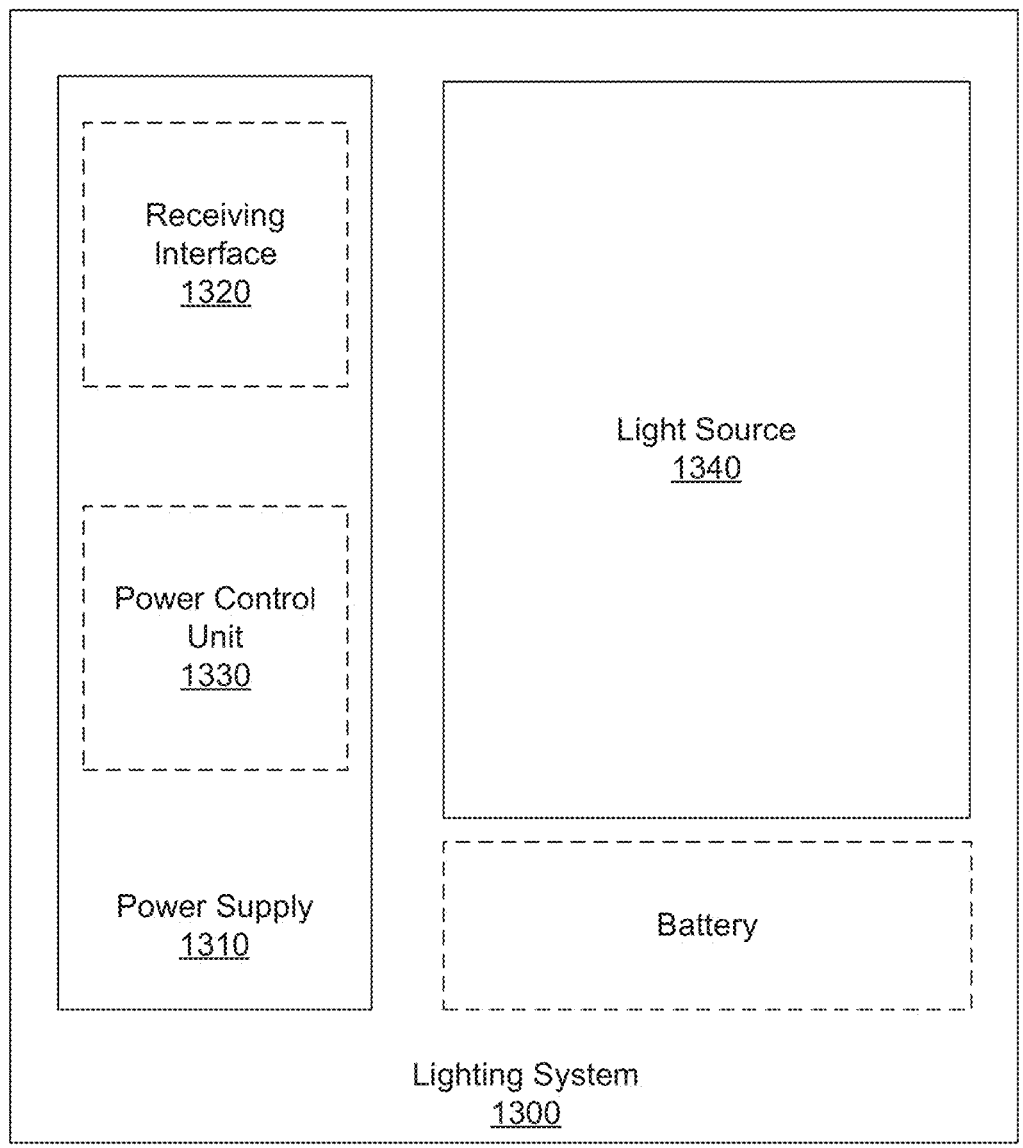
FIG. 13 is a schematic illustration of a lighting system in accordance with an embodiment of the invention.

FIG. 13 illustrates a lighting system 1300 in accordance with an embodiment. The lighting system houses a power supply 1310, which may include a receiving interface 1320 for receiving power, and a power control unit 1330 for controlling power to be supplied to the light source 1340. Power may be supplied from outside the lighting system 1300 or from a battery optionally included in the lighting system 1300. In some embodiments, the light source 1340 includes one or more micro LED devices 100 that are formed in accordance with embodiments of the invention described above. For example, the light source 1340 may include a plurality of micro LED devices and a plurality of wavelength conversion layers around the micro LED devices. In various implementations, the lighting system 1300 may be interior or exterior lighting applications, such as billboard lighting, building lighting, street lighting, light bulbs, and lamps.

In utilizing the various aspects of this invention, it would become apparent to one skilled in the art that combinations or variations of the above embodiments are possible for integrating micro LED devices and wavelength conversion layers into lighting and display application. Although the present invention has been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating the present invention.

What is claimed is:

1. A light emitting device comprising:
   an array of bottom electrodes;
   a corresponding array of micro LED devices bonded to the array of bottom electrodes, wherein each micro LED device has a maximum width of 1 μm-100μ, exactly one micro LED device is bonded to a corresponding bottom electrode, and each micro LED device is individually addressable through the corresponding bottom electrode;
   a sidewall passivation layer comprising a cured polymer formed around sidewalls of the array of micro LED devices, and an uppermost level top surface that does not extend above a top surface for each of the micro LED devices;
   one or more top electrode layers that spans over the array of micro LED devices and the level top surface of the sidewall passivation layer and is in electrical contact with the array of the micro LED devices; and
   an array of wavelength conversion layers, wherein each wavelength conversion layer is around a corresponding micro LED device and comprises phosphor particles.

2. The light emitting device of claim 1, wherein each of the micro LED devices is designed to emit a primarily blue or deep blue light.

3. The light emitting device of claim 1, wherein the phosphor particles are quantum dots.

4. The light emitting device of claim 1, wherein the phosphor particles exhibit luminescence due to their composition.

5. The light emitting device of claim 1, wherein each of the wavelength conversion layers is dome shaped, and the phosphor particles are dispersed in a polymer or glass matrix.

6. The light emitting device of claim 5, further comprising an array of transparent light distribution layers, wherein each transparent light distribution layer is between a corresponding micro LED device and a corresponding wavelength conversion layer.

7. The light emitting device of claim 6, wherein each transparent light distribution layer is dome shaped.

8. The light emitting device of claim 6, wherein each transparent light distribution layer comprises a material selected from the group consisting of glass epoxy, silicone, and acrylic.

9. The light emitting device of claim 5, wherein the polymer matrix comprises a material selected from the group consisting of epoxy, silicone, and acrylic.

10. The light emitting device of claim 6, wherein the polymer matrix comprises a first polymer and each transparent light distribution layer comprises the first polymer.

11. The light emitting device of claim 6, wherein each transparent light distribution layer has a refractive index within 0.1 of a refractive index of a corresponding wavelength conversion layer.

12. The light emitting device of claim 1, further comprising an oxygen barrier film over the array of wavelength conversion layers, wherein the oxygen barrier film comprises a material selected from the group consisting of: $Al_2O_3$, $SiO_2$, $SiN_x$, and spin on glass.

13. The light emitting device of claim 1, further comprising an array of color filters above the array of wavelength conversion layers or dispersed within the array of wavelength conversion layers.

14. The light emitting device of claim 1, wherein each micro LED device is designed to emit the same emission spectrum.

15. The light emitting device of claim 1, wherein each wavelength conversion layer is designed to emit the same color emission spectrum.

16. The light emitting device of claim 1, wherein the array of wavelength conversion layers comprises multiple groups of wavelength conversion layers, with each group designed to emit a different color emission spectrum.

17. The light emitting device of claim 16, further comprising an array of pixels, each pixel comprising at least one wavelength conversion layer from each of the multiple groups of wavelength conversion layers.

18. The light emitting device of claim 1, further comprising:
   an array of pixels, each pixel comprising a plurality of subpixels designed for different color emission spectra, wherein the plurality of subpixels comprises:
   a first subpixel including:
      a first micro LED device bonded to a first bottom electrode;

a first top electrode layer spanning over the first micro LED device and the sidewall passivation layer and in electrical contact with the first micro LED device;

a first wavelength conversion layer around the first micro LED device and only partially over the first top electrode layer, the first wavelength conversion layer comprising a first dispersion of phosphor particles within a polymer or glass matrix; and a second subpixel including:

a second micro LED device bonded to a second bottom electrode;

a second top electrode layer spanning over the second micro LED device and the sidewall passivation layer and in electrical contact with the second micro LED device;

a second wavelength conversion layer around the second micro LED device and only partially over the second top electrode layer, the second wavelength conversion layer comprising a second dispersion of phosphor particles within a polymer or glass matrix;

wherein the first and second micro LED devices have the same composition for the same emission spectrum, and the first and second dispersions of phosphor particles are designed for different color emission spectra.

19. The light emitting device of claim 18, wherein the first and second top electrode layers are physically and electrically connected.

20. The light emitting device of claim 1, further comprising:

an array of pixels, each pixel comprising a plurality of subpixels designed for different color emission spectra, wherein the plurality of subpixels comprises:

a first subpixel including:

a first micro LED device bonded to a first bottom electrode;

a first top electrode layer spanning over the first micro LED device and the sidewall passivation layer and in electrical contact with the first micro LED device;

a first wavelength conversion layer around the first micro LED device and only partially over the first top electrode layer, the first wavelength conversion layer comprising a first dispersion of phosphor particles within a polymer or glass matrix; and a second subpixel including:

a second micro LED device bonded to a second bottom electrode;

a second top electrode layer spanning over the second micro LED device and the sidewall passivation layer and in electrical contact with the second micro LED device;

wherein a wavelength conversion layer comprising phosphor particles is not formed around the second micro LED device.

21. The light emitting device of claim 1, wherein each micro LED device further comprises a micro p-n diode between a top conductive contact and a bottom conductive contact, and each bottom conductive contact is bonded to a corresponding bottom electrode underneath the micro LED device.

22. The light emitting device of claim 21, wherein each wavelength conversion layer is formed only partially over a corresponding top electrode layer.

23. The light emitting device of claim 22, wherein the sidewall passivation layer comprises a filler selected from the group consisting of phosphor particles, pigment, dye, and scattering particles.

24. The light emitting device of claim 20, wherein each micro LED device further comprises a micro p-n diode between a top conductive contact and a bottom conductive contact, and each bottom conductive contact is bonded to a corresponding bottom electrode underneath the micro LED device.

25. The light emitting device of claim 24, wherein the one or more top electrode layers is a single top electrode layer formed of a transparent material.

26. The light emitting device of claim 25, wherein:

the single top electrode layer spans over each micro LED device and is in electrical contact with each micro LED device; and each wavelength conversion layer is only partially over the single top electrode layer.

27. The light emitting device of claim 1, wherein:

each micro LED device further comprises a top conductive contact, and the one or more top electrode layers is a single top electrode layer that is on and in electrical contact with the top conductive contact of each micro LED device; and the uppermost level top surface of the sidewall passivation layer does not cover the top conductive contact of each micro LED device.

28. The light emitting device of claim 27, wherein an entire portion of the sidewall passivation layer directly underneath the plurality of wavelength conversion layers is characterized as having the uppermost level top surface.

29. The light emitting device of claim 27, wherein an entirety of the sidewall passivation layer is characterized as having the uppermost level top surface.

30. The light emitting device of claim 27, wherein each micro LED device further comprises a micro p-n diode, and a conformal dielectric barrier layer along the sidewalls of the micro p-n diode.

* * * * *